US011764209B2

(12) United States Patent
Sdrulla

(10) Patent No.: US 11,764,209 B2
(45) Date of Patent: Sep. 19, 2023

(54) POWER SEMICONDUCTOR DEVICE WITH FORCED CARRIER EXTRACTION AND METHOD OF MANUFACTURE

(71) Applicant: MW RF Semiconductors, LLC, Bend, OR (US)

(72) Inventor: Dumitru G. Sdrulla, Bend, OR (US)

(73) Assignee: MW RF Semiconductors, LLC, Bend, OR (US)

( * ) Notice: Subject to any disclaimer, the term of this patent is extended or adjusted under 35 U.S.C. 154(b) by 0 days.

(21) Appl. No.: 17/339,832

(22) Filed: Jun. 4, 2021

(65) Prior Publication Data

US 2022/0122962 A1 Apr. 21, 2022

Related U.S. Application Data

(60) Provisional application No. 63/093,701, filed on Oct. 19, 2020.

(51) Int. Cl.
| | | |
|---|---|---|
| *H01L 27/02* | (2006.01) | |
| *H01L 27/06* | (2006.01) | |
| *H01L 29/739* | (2006.01) | |
| *H01L 29/868* | (2006.01) | |
| *H01L 29/872* | (2006.01) | |

(52) U.S. Cl.
CPC ...... *H01L 27/0292* (2013.01); *H01L 27/0623* (2013.01); *H01L 27/0629* (2013.01); *H01L 29/7395* (2013.01); *H01L 29/868* (2013.01); *H01L 29/872* (2013.01)

(58) Field of Classification Search
CPC .................. H01L 27/0292; H01L 27/0623

USPC .......................................................... 257/665
See application file for complete search history.

(56) References Cited

U.S. PATENT DOCUMENTS

| | | | |
|---|---|---|---|
| 5,610,439 | A | 3/1997 | Hiyoshi et al. |
| 5,894,154 | A | 4/1999 | Shibib |
| 6,861,711 | B2 | 3/2005 | Mallikarjunaswamy |
| 6,864,537 | B1 | 3/2005 | Mallikarjunaswamy |

(Continued)

FOREIGN PATENT DOCUMENTS

| | | | |
|---|---|---|---|
| CN | 1643698 | * | 7/2005 |
| JP | 4156717 | * | 7/2008 |

OTHER PUBLICATIONS

Texas Instruments Application Report, SLUA618A, Mar. 2017, Revised Oct. 2018 "Fundamentals of MOSFET and IGBT Gate Driver Circuits" by Laszlo Balogh.*

(Continued)

*Primary Examiner* — Sheng-Bai Zhu

(57) ABSTRACT

This disclosure relates to semiconductor devices, and, more particularly, to a semiconductor structure that improves the switching speed of a switch for which the turn-off process depends on the recombination speed of charge carriers. The disclosure describes a semiconductor device formed on a semiconductor substrate that includes a power semiconductor switch having a drift region in the semiconductor substrate, an Extraction Plug in electrical contact with the drift region of the power semiconductor switch, and an extraction device electrically coupled to the Extraction Plug. The extraction device is structured to remove charge carriers from the drift region through the Extraction Plug when the extraction device is turned on. Methods are also described.

17 Claims, 32 Drawing Sheets

(56) References Cited

U.S. PATENT DOCUMENTS

| | | |
|---|---|---|
| 7,622,787 B2 | 11/2009 | Hshieh et al. |
| 8,564,097 B2 | 10/2013 | Udrea et al. |
| 8,686,513 B1 | 4/2014 | Seok |
| 9,349,847 B2 | 5/2016 | Hashimoto et al. |
| 9,716,072 B2 | 7/2017 | Kawashima et al. |
| 9,917,181 B2 | 3/2018 | Pfirsch et al. |
| 10,002,807 B2 | 6/2018 | Ookura |
| 10,249,619 B2 | 4/2019 | Takahashi |
| 10,439,025 B2 | 10/2019 | Pfirsch et al. |
| 10,461,739 B2 | 10/2019 | Basler et al. |
| 10,475,909 B2 | 11/2019 | Basler et al. |
| 2005/0062101 A1* | 3/2005 | Sugi ............... H01L 21/84 257/330 |
| 2005/0195179 A1* | 9/2005 | Kobayashi ......... G09G 3/296 345/204 |
| 2006/0258081 A1 | 11/2006 | Kocon et al. |
| 2008/0122497 A1 | 5/2008 | Ishikawa et al. |
| 2009/0057832 A1 | 3/2009 | Kouno |
| 2011/0186907 A1* | 8/2011 | Fujii ............. H01L 29/66325 257/E21.388 |
| 2012/0098573 A1 | 4/2012 | Sasaki |
| 2013/0001703 A1 | 1/2013 | Sugawara |
| 2013/0134509 A1 | 5/2013 | Hirler |
| 2014/0118055 A1 | 5/2014 | Seok |
| 2016/0233202 A1 | 8/2016 | Komo et al. |
| 2016/0254373 A1* | 9/2016 | Harrington, III ... H01L 27/1203 257/140 |
| 2017/0040423 A1 | 2/2017 | Inoue et al. |
| 2018/0145162 A1* | 5/2018 | Seok ............... H01L 29/0696 |
| 2018/0308972 A1 | 10/2018 | Ohse et al. |

OTHER PUBLICATIONS

Alirezaei et al., "Analysis of pn Junction Deep Trench Isolation with SU-8/SiO2-Liner Passivation in a Linear Butt-Coupled 3D CMOS Si Photodetector Array," Multidisciplinary Digital Publishing Institute Proceedings 2017, 1 (4), 557, 5 pages.

Antoniou et al., "Deep p-Ring Trench Termination: An Innovative and Cost-Effective Way to Reduce Silicon Area," IEEE Electron Device Letters, vol. 40, No. 2, Feb. 2019, pp. 177-180.

Baccar et al., "First Assemblies Using Deep Trench Termination Diodes," 2014 IEEE 26th International Symposium on Power Semiconductor Devices & IC's (ISPSD), 2014, pp. 143-146.

Boisvert et al., "The Complementary Insulated-Gate Bipolar Transistor (CIGBT)—A New Power Switching Device," IEEE Electron Device Letters, vol. 11, No. 9, Sep. 1990, pp. 368-370.

Boisvert et al., "Circuit Approaches to Increasing IGBT Switching Speed," IEEE Journal of Solid-State Circuits, vol. 23, No. 5, Oct. 1988, pp. 1276-1279.

Bolbot et al., A Comparison of Trench Filling Materials for Sub-Micron CMOS, Journal de Physique Colloques, 1988, 49 (C4), pp. C4-537-C4-540.

Findlay et al., Reverse-Conducting Insulated Gate Bipolar Transistor: A Review of Current Technologies, IEEE Transactions on Electron Devices, vol. 66, No. 1, Jan. 2019, pp. 219-231.

Li et al., "Turnoff Transient Characteristics of Complementary Insulated-Gate Bipolar Transistor, " IEEE Transactions on Electron Devices, vol. 41, No. 12, Dec. 1994, pp. 2468-2471.

Noblecourt et al., "Design Optimisation of the Deep Trench Termination for Superjunction Power Devices," International Journal of Microelectronics and Computer Science, vol. 6, No. 4, 2015, pp. 117-123.

Parthasarathy et al., "A 0.25μm CMOS based 70V smart power technology with deep trench for high-voltage isolation," presented at the International Electron Devices Meeting, San Francisco, CA, Dec. 2002, 4 pgs.

Pattanayak, et al., "Low-Voltage, Super-Junction Technology," Presented at the 7th International Seminar on Power Semiconductors, ISPS'06, Prague, Czech Republic, 2006, 27 pages.

Reyboz et al., Improved Carrier Mobility in Compact Model of Independent Double Gate MOSFET, NSTI—Nanotech 2008, vol. 3, pp. 881-884.

Takahashi et al., "20mΩcm2 660V Super Junction MOSFETs Fabricated by Deep Trench Etching and Epitaxial Growth," 2006 IEEE International Symposium on Power Semiconductor Devices and IC's, 2006, pp. 1-4.

Théolier et al., "A new junction termination technique: the Deep Trench Termination (DT2)," 2009 21st International Symposium on Power Semiconductor Devices & IC's, 2009, pp. 176-179.

Yamaguchi et al., "High aspect ratio deep trench termination (HARDT2) technique surrounding die edge as dielectric wall to improve high voltage device area efficiency," 2017 29th International Symposium on Power Semiconductor Devices and IC's (ISPSD), 2017, pp. 479-482.

Yu, "Design and Fabrication of Superjunction Power MOSFET Devices," National University of Singapore, Ph.D. Thesis, Aug. 2008, 217 pages.

Zingg, "On the Specific On-Resistance of High-Voltage and Power Devices," IEEE Transactions on Electron Devices, vol. 51, No. 3, Mar. 2004, pp. 492-499.

Adler, "A Comparison Between BIMOS Device Types," 1982 IEEE Power Electronics Specialists conference, 1982, pp. 371-377.

Baliga et al., "The MOS Depletion-Mode Thyristor: A New MOS-Controlled Bipolar Power Device," IEEE Electron Device Letters, vol. 9, No. 8, Aug. 1988, pp. 411-413.

Baliga, "Fast-Switching Insulated Gate Transistors," IEEE Electron Device Letters, vol. EDL-4, No. 12, Dec. 1983, pp. 452-454.

Baliga, "Trends in Power Semiconductor Devices," IEEE Transactions on Electron Devices, vol. 43, No. 10, Oct. 1996, pp. 1717-1731.

Bar-Lev et al., "Measurements on Light Emission and Current Distribution in Avalanching Epitaxial Diodes," IEEE Transactions on Electron Devices, vol. 21, No. 8, Aug. 1974, pp. 537-539.

Choo, "Effect of Carrier Lifetime on the Forward Characteristics of High-Power Devices," IEEE Transactions on Electron Devices, vol. ED-17, No. 9, Sep. 1970, pp. 647-652.

Chow et al., "A Self-Aligned Short Process for Insulated Gate Transistors," 1985 International Electron Devices Meeting, 1985, pp. 146-149.

Darling, "A Full Dynamic Model for pn-Junction Diode Switching Transients," IEEE Transactions on Electron Devices, vol. 42, No. 5, May 1995, pp. 969-976.

Fossum et al., "An Insightful Analysis of the Hybrid Insulated-Gate Bipolar Transistor," IEEE Transactions on Electron Devices, vol. 35, No. 9, Sep. 1988, pp. 1560-1562.

Fulkerson, "The Characterization of the Static Behavior of p-n Junction Devices," IEEE Transactions on Electron Devices, vol. ED-14, No. 7, Jul. 1967, pp. 385-395.

Githiari et al., "A Comparison of IGBT Models for Use in Circuit Design," IEEE Transactions on Power Electronics, vol. 14, No. 4, Jul. 1999, pp. 607-614.

Goodman et al., "Improved COMFETs with Fast Switching Speed and High-Current Capability," 1983 International Electron Devices Meeting, 1983, pp. 79-82.

Han et al., Leakage Mechanisms in the Heavily Doped Gated Diode Structures, IEEE Electron Device Letters, vol. 12, No. 2, Feb. 1991, pp. 74-76.

Hefner et al., The Effect of Neutrons on the Characteristics of the Insulated Gate Bipolar Transistor (IGBT), IEEE Transactions on Nuclear Science, vol. NS-33, No. 6, Dec. 1986, pp. 1428-1434.

Hefner, An Investigation of the Drive Circuit Requirements for the Power Insulated Gate Bipolar Transistor (IGBT), 21st Annual IEEE Conference on Power Electronics Specialists, 1990, pp. 126-137.

Johnson, "Power-Delay Energy Comparison of Bipolar and IGFET Digital Devices and Circuits," IEEE Transactions on Electron Devices, Nov. 1975, pp. 1044-1045.

Kannam, Design Concepts of High Energy Punchthrough Structures, IEEE Transactions on Electron Devices, vol. ED-23, No. 8, Aug. 1976, pp. 879-882.

Kao, "The Design of High-Voltage High-Power Silicon Junction Rectifiers," IEEE Transactions on Electron Devices, vol. ED-17, No. 9, Sep. 1970, pp. 657-660.

(56) References Cited

OTHER PUBLICATIONS

Kuo et al., "Optimization of Epitaxial Layers of Power Bipolar-MOS Transistor," IEEE Electron Device Letters, vol. EDL-7, No. 9, Sep. 1986, pp. 510-512.

Lekholm et al., "Edge Breakdown in Mesa Diodes," IEEE Transactions on Electron Devices, vol. ED-18, No. 10, Oct. 1971, pp. 844-848.

Liu et al., "A Novel Trench-Injector Power Device with Low ON Resistance and High Switching Speed," IEEE Electron Device Letters, vol. 9, No. 7, Jul. 1988, pp. 321-323.

Mehrotra et al., "Low Forward Drop JBS Rectifiers Fabricated Using Submicron Technology," IEEE Transactions on Electron Devices, vol. 41, No. 9, Sep. 1994, pp. 1655-1660.

Mogro-Campero et al., "Shorter Turn-Off Times in Insulated Gate Transistors by Proton Implantation," IEEE Electron Device Letters, vol. EDL-6, No. 5, May 1985, pp. 224-226.

Plummer et al., "Insulated-Gate Planar Thyristors: I-Structure and Basic Operation," IEEE Transactions on Electron Devices, vol. ED-27, No. 2, Feb. 1980.

Ramamurthy, et al., "Modeling the [dV/dt] of the IGBT During Inductive Turn Off," IEEE Transactions on Power Electronics, vol. 14, No. 4, Jul. 1999, pp. 601-606.

Schlangenotto et al., "Spatial Composition and Injection Dependence of Recombination in Silicon Power Device Structures," IEEE Transactions on Electron Devices, vol. ED-26, No. 3, Mar. 1979, pp. 191-200.

Schnable et al., "Development of Large-Area 200-Volt Planar Voltage-Variable Capacitance Diodes," IEEE Transactions on Electron Devices, vol. ED-13, No. 12, Dec. 1966, pp. 896-900.

Stoisiek et al., "MOS GTO—A Turn Off Thyristor with MOS-Controlled Emitter Shorts," 1985 International Electron Devices Meeting, 1985, pp. 158-161.

Strifler et al., "Comparison of Neutron and Electron Irradiation for Controlling IGT Switch Speed," IEEE Transactions on Electron Devices, vol. ED-32, No. 9, Sep. 1985, pp. 1629-1632.

Temple, "MOS-Controlled Thyristors—A New Class of Power Devices," IEEE Transactions on Electron Devices, vol. ED-33, No. 10, Oct. 1986, pp. 1609-1618.

Thapar et al., "The Accumulation Channel Driven Bipolar Transistor (ACBT)," IEEE Electron Device Letters, Vo. 18, No. 5, May 1997, pp. 178-180.

Trivedi et al., "Internal Dynamics of IGBT Under Zero-Voltage and Zero-Current Switching Conditions," IEEE Transactions on Electron Devices, vol. 46, No. 6, Jun. 1999, pp. 1274-1282.

Trivedi et al., "Modeling the Turn-Off of IGBT's in Hard- and Soft-Switching Applications," IEEE transactions on Electron Devices, vol. 44, No. 5, May 1997, pp. 887-893.

Trivedi et al., "Switching Characteristics of MCT's and IGBT's in Power Converters," IEEE Transactions on Electron Devices, vol. 43, No. 11, Nov. 1996, pp. 1994-2003.

Tsunoda et al., "Improved 600- and 1200-V IGBT with Low Turn-Off Loss and High Ruggedness," 21st Annual IEEE Conference on Power Electronics Specialists, 1990, pp. 9-16.

International Search Report and Written Opinion of the International Searching Authority issued in International Application No. PCT/US2021/055473, dated Feb. 2, 2022 (13 pages).

International Search Report and Written Opinion of the International Searching Authority issued in International Application No. PCT/US2021/055475, dated Feb. 2, 2022, 17 pages.

Jung et al., "Design and Fabrication of Super Junction MOSFET Based on Trench Filling and Bottom Implantation Process," Journal of Electrical Engineering and Technology, vol. 9, No. 3, May 2014, pp. 964-969.

\* cited by examiner

POWER SEMICONDUCTOR DEVICE WITH FORCED CARRIER EXTRACTION AND METHOD OF MANUFACTURE

CROSS-REFERENCE TO RELATED APPLICATIONS

This application is a non-provisional of and claims benefit to U.S. provisional patent application No. 63/093,701, filed Oct. 19, 2020, titled SEMICONDUCTOR STRUCTURE HAVING A FORCED EXTRACTION DEVICE, the disclosure of which is incorporated herein by reference in its entirety.

TECHNICAL FIELD

This disclosure relates to semiconductor devices, and, more particularly, to a semiconductor structure that improves the switching speed of a switch for which the turn-off process depends on the recombination speed of charge carriers.

BACKGROUND

This disclosure describes inventions in the field of power semiconductors. The terminology used in this disclosure employs terms and symbols widely used in the semiconductor field, and the technology is described at a level to those having skill in the art.

Semiconductor devices may be broadly distinguished based on their number of different charge carriers. A device with only a single type of charge carrier, such as electrons or holes, is termed a unipolar device, while a device that uses both electrons and holes as charge carriers is a bipolar device. A Metal Oxide Semiconductor Field Effect Transistor (MOSFET) is a popular unipolar device, and is known as a majority carrier device since in operation its current is carried by a primary charge carrier. In contrast, an Insulated Gate Bipolar Transistor (IGBT), for example, is a bipolar device that uses both electrons and holes for its current flow. Bipolar devices may be voltage controlled devices or current controlled devices.

The structural differences between unipolar and bipolar devices causes these devices to behave differently. Because of their structure, MOSFETs have significantly lower turn-off energies than do IGBTs. This lower turn-off energy allows MOSFETs to operate at significantly higher frequencies compared to their IGBT counterparts.

Conversely, MOSFETs, other than those made on SiC (Silicon Carbide), have a relatively high ON resistance compared to IGBTs, leading to a relatively high turn-on voltage. This, in turn, causes MOSFETs to have higher conduction losses compared to bipolar power semiconductors that employ conductivity modulation.

Although there are power devices made from MOSFETs, and even though MOSFETs made on SiC have a relatively low ON resistance, in general, IGBTs are more often selected over MOSFETs when large amounts of current need to be switched ON and OFF in power devices. This is due to the increased current capacity per area of IGBTs over MOSFETs.

For all their advantages, however, IGBTs suffer from a serious performance metric, which is that IGBTs in general exhibit relatively long turn-off times. The long turn-off time is due to the physical structure of an IGBT device. Specifically, the slow turn-off times of IGBT devices is due to a slow recombination of minority carriers in the device after switching OFF. This well-known long tail of collector current is a major drawback of using IGBTs and limits their operating frequency.

This disclosure describes performance characteristics of IGBTs as well as other related power devices. In general, IGBTs are solid state devices that, due to their structure, lack an electrode or terminal to remove excess charge carriers from their drift regions during their operation.

This disclosure generally refers to these structures as an IGBT, a main switch, or main switches, but concepts of the invention apply broadly to all solid state switches lacking an electrode or terminal for removing excess carriers that operate by conductivity modulation.

As depicted schematically in FIG. 1, an IGBT 10 has a MOSFET structure 12 formed on the front side of the die and a P-N junction formed on the backside of the structure. The IGBT schematically illustrated in FIG. 1 can be of any type, e.g. planar, trench, punch-through or non-punch-through, or with enhanced injection, etc. Some of the parasitic elements of the circuit, like the built-in NPN and JFET parasitic components, are left out of the schematic model of FIG. 1 as they are inconsequential to the substance of this invention. The turn-on portion of the switching process of an IGBT is almost identical to a MOSFET having the same or similar die size. Conversely, the turn-off phase of the switching process of an IGBT is significantly slower than a MOSFET made on Silicon or SiC, since the carriers injected in the drift region (e.g., holes for a N-channel IGBT), need to recombine before the voltage across the device can start to increase. The main drawback of the IGBT 10 of FIG. 1 is the lack of access to a drain 14 of the MOSFET 12, which also serves as the base of a PNP transistor 22. The drain 14 of the MOSFET 12 is located in between the backside side of the structure and the Body Junction, which is part of the Vertical Diffused Metal Oxide Semiconductor (VDMOS) transistor in an IGBT. The emitter of the PNP transistor 22 is the "injector" part, and its efficiency plays a role in the on-voltage of the IGBT and in the length of time for the turn-off process. A higher injection of holes in the drift region correlates to a lower Vce(sat) of the IGBT, which causes its Tfall to be very long. The drift region of the IGBT defines the blocking voltage of the device and it is not accessible from the outside of the die. In operation, the PNP transistor 22 injects holes into the N-type region, which is the drift layer of the MOSFET 12, to fulfill the requirement of charge neutrality. This injection of holes causes the ON voltage of the device to be LOW based on the concept of conductivity modulation. Although having this low ON voltage is desirable, at turn-off, this charge needs to disappear through recombination. But, unlike a source 11 and a gate 13 of the MOSFET, which each have terminals, there is no terminal coupled to the drain 14 of the MOSFET 12. Due to this limitation, the efficient removal of carriers in the drift region of the MOSFET 12 or in the Base of the PNP transistor 22 in the IGBT 10 illustrated in FIG. 1 is impossible, and consequently makes the turn-off time of the IGBT relatively very long.

Modern IGBTs have attempted to solve the problem of removing carriers in the drift region in a variety of ways. In the case of punch-through IGBTs, techniques include employing either lifetime control, like Platinum, Helium, or Electron Irradiation, or other types of lifetime killing processes, or a tightly controlled "injection" of carriers from the P-type layer on the backside. In the case of Field Stop IGBTs, even more elaborate schemes may be employed by using an N-Type buffer layer and a low injection emitter. Such techniques are problematic as they involve additional processing to create the devices, or they require a more controlled operation compared to standard devices. Even with these attempted techniques the final result is still unsatisfactory from an ON-voltage switching speed tradeoff point of view.

FIG. 2 is a graph generally illustrating energy losses of IGBTs and how different devices made by different producers compare to one another. Energy losses may exhibit as switching losses or conduction losses. The chart in FIG. 2 illustrates that IGBT devices may trade off switching losses for conduction losses, and vice-versa. In other words, a producer may make an IGBT having lower switching losses, but such a device will consequently have higher conduction losses. The goal would be to minimize both switching and conduction losses, but it is difficult to lower the total energy losses in an IGBT due to the relatively long turn-off times of the IGBT devices, which cause the energy loss.

In sum, IGBTs have certain advantages and disadvantages when used as power devices as set forth in Table 1.

TABLE 1

| ADVANTAGES OF IGBT | DISADVANTAGES OF IGBT |
| --- | --- |
| Simple gate circuit | Latch-ups due to the PNPN structure |
| Low ON voltage | Low operating temperature |
| High voltage capability | Long turn-off time |
| Low drive power | |
| Low ON state power dissipation | |
| Low gate drive requirements | |
| High Input impedance | |
| Small snubber circuit requirements | |
| High current conduction capabilities | |
| Easy turn ON and turn OFF | |
| Excellent reverse blocking capabilities | |
| High Short-Circuit withstanding time | |

Thus, although IGBTs remain an excellent choice for those semiconductor devices carrying relatively large amounts of current, so called power devices, the slow switching speeds caused by the slow recombination of minority carriers in conductivity-modulation bipolar devices after switching off continues to inhibit their performance.

The published paper "The Complementary Insulated-Gate Bipolar Transistor (CIGBT)—A New Power Switching device" IEEE Electron device Letters, vol 11, no. 9, September 1990, by D. M. Boisvert and James. D. Plumer, (hereinafter "Boisvert") proved that, under certain conditions, an integrated PMOS transistor could extract the charge left over at base of the PNP transistor after the IGBT turns-off. Such charge is extracted through a MOSFET, which turns on as the IGBT turns off. This configuration greatly speeds up the switching speed of the IGBT 10.

An integrated IGBT and PMOS transistor device was designed and produced by Boisvert and Plumer, and its switching speed for different sizes (i.e., channel widths) of the PMOS were acquired. The constraints of their implementation were related to the need of Boisvert to place the PMOS transistor relatively far from the IGBT, so that the drift region of the IGBT and the substrate of the PMOS were far enough apart to consider them "electrically disconnected".

FIG. 3 is a simplified cross-sectional diagram of a complimentary IGBT as published in the Boisvert paper. As depicted in FIG. 3, an integrated structure 90 includes an IGBT (N-Channel) on the left side of the cross section and a PMOS transistor, placed at a relatively far distance from the active area of the IGBT. For the low voltage design employed in the Boisvert paper, the IGBT does not need a high voltage termination. Also, the 50V clamp voltage of the resistive switching speed circuit used to test the CIGBT devices in the Boisvert paper is low enough such that the main drawback of this implementation is not revealed.

The extraction pads 102 that are connected to the source of the PMOS are placed in Boisvert design between the P-Wells by cutting windows in the polysilicon gate and gate oxide, and inserting an N++ doped region inside of the cut windows. The lateral distance between the N++ regions of the extraction pad 102 and its P-Wells 101 determines the blocking voltage of the device. Since they are relatively close to one another, the blocking capability of the Boisvert device is limited to 100V or less, which is not suitable for many real-world applications where the minimum rating voltage of an IGBT needs to be 300V or higher. As a general rule, for Silicon, every one micron, a lightly doped region, such as a drift layer, can block about 10 V. For example, in the case of a 1,200V IGBT, the space around the N++ regions must be at least 120 um. Having such a wide polysilicon gate is detrimental to all device static or dynamic parameters of the IGBT, and that is one reason this device has never been used in the power semiconductor field. This relatively low operating voltage of Boisvert's implementation due to its lateral spacing between N++ regions is one of its main drawbacks.

A further drawback of Boisvert's implementation is also related to operating voltages. Since Boisvert's drain of the PMOS transistor, depicted at the right side of the cross section of FIG. 2, is connected to the collector of the IGBT, the voltage across the gate-drain oxide of the PMOS is exactly the voltage applied between the collector and the emitter of the IGBT. This location is indicated by a star and reference number 25 in FIG. 3.

A typical thicknesses of the gate oxides of power MOSFETs (N-channel or P-channel) are in the range of 500 Å to 2000 Å, and the dielectric strength of such oxide ranges from 25V to, in the best case, 200V. These voltages are significantly lower than the voltage range of the modern, high power, high voltage, IGBTs, which is anywhere from 300V-6,500V, or even higher. Due to the relatively thin oxide layer in the Boisvert implementation, the area of FIG. 2 depicted at 25 indicates where the gate oxide of the PMOS transistor will be "zapped" or destroyed, due to overvoltage. This destruction will also cause the entire device to cease to function.

Significantly shorter fall times of such concept were documented, four years after publication of the Boisvert paper, by Zhaoji Li and Juan Du, in the article "Turnoff Transient Characteristics of Complementary Insulated-Gate Bipolar Transistor," IEEE Transaction on Electron devices, vol 41, No 12, December 1994, which published an analytical model for the fast turn off characteristics of this type of device.

Despite the Boisvert and Li publications, no further developments of these quite impressive and promising results were published, apparently due to difficulty in implementing such structures for real-time industrial applications.

Embodiments of the disclosure address these and other limitations of the prior art.

DETAILED DESCRIPTION OF THE DRAWINGS

In accordance with the present disclosure, an IGBT or other conductivity modulated bipolar device is formed adjacent to or integrated with an extraction device that is structured to remove excess charge carriers from the bipolar device after the device has switched OFF. The extraction device is electrically coupled to the drift area of the device through an Extraction Plug. In operation, the extraction device removes the excess charge carriers from the drift region relatively quickly, greatly increasing the switching speed of the bipolar device. In certain embodiments both the main device as well as the extraction device are voltage-controlled devices.

Embodiments of the invention provide a novel combination of components that operate at a higher operation frequency than present devices, with the added benefit of a smaller sized power circuit, similar to those touted for using unipolar switching type of devices, like a MOSFET made on Silicon or SiC.

In embodiments, a main switch, such as any type of IGBT, includes Extraction Plugs, either in the active area of the IGBT or outside of the active area. These Extraction Plugs may be located at the top surface of the IGBT or deep inside of the semiconductor bulk in a trench structure. The Extraction Plugs are properly designed to preserve the blocking capability of the main switch and are electrically connected to the extraction device. As mentioned above, the extraction device may be a P-channel MOS transistor (PMOS transistor).

Figures 4A, 4B:
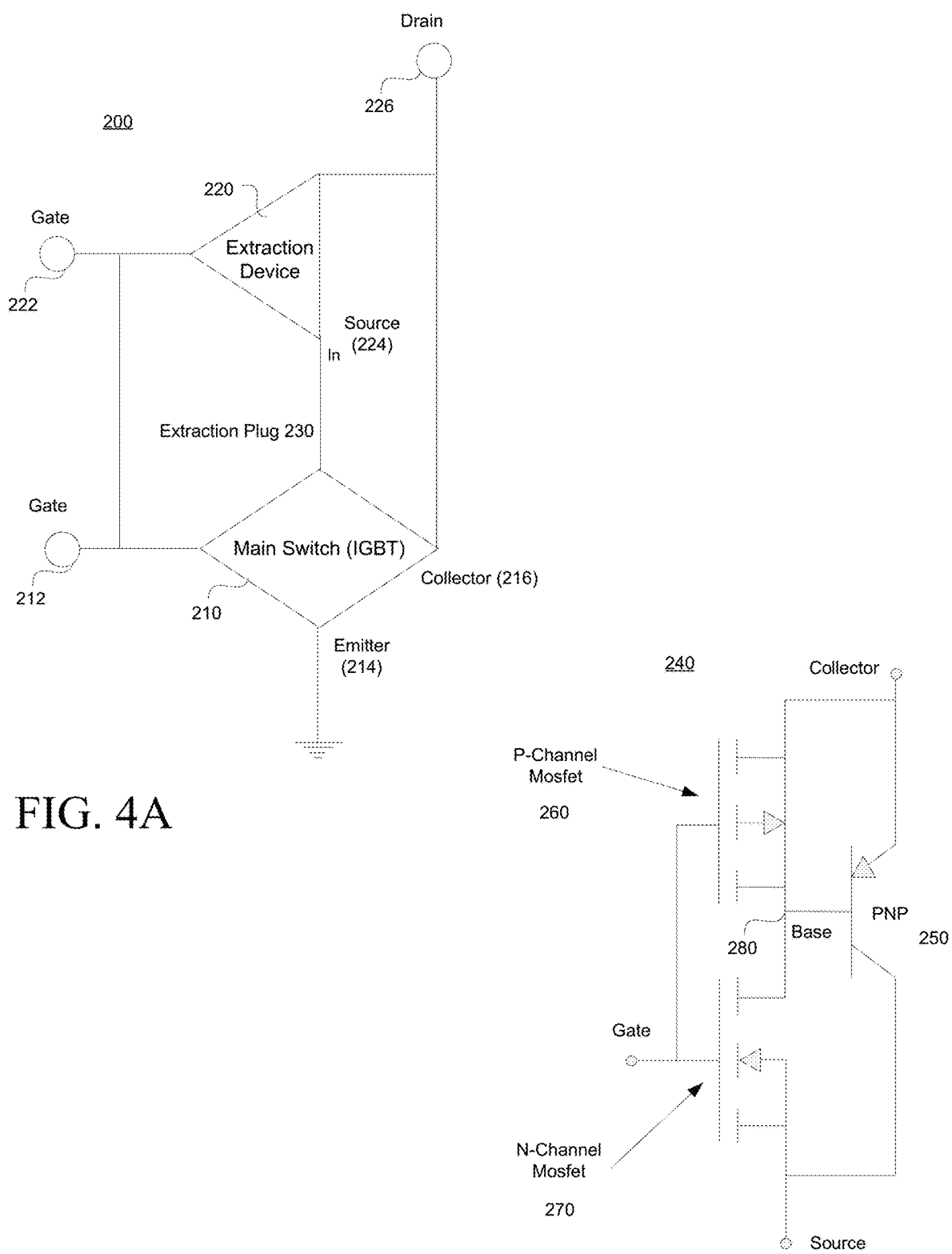
FIG. 4A is a conceptual schematic diagram of a switch having an extraction terminal, connected to a voltage-controlled extraction device, according to embodiments of this disclosure.
FIG. 4B is a schematic diagram of a complementary IGBT having an injecting PNP transistor, as a P-channel MOSFET, and an N-channel MOSFET coupled in series, according to embodiments of the disclosure.

FIG. 4A is a conceptual schematic diagram in accordance with embodiments of the invention. A combined device 200 generally includes a main switch 210 coupled to an extraction device 220. The device 200 further includes one or more Extraction Plugs 230 formed in the drift layer of the main switch 210. The Extraction Plugs 230 are formed and placed so that they do not degrade, in any way, the performance of the structure 200, especially its blocking voltage. The forced extraction device 220 is preferably voltage controlled, and its blocking voltage between terminals is generally the same or higher than the blocking voltage of the main switch 210. For instance, the structure 200 of FIG. 4A includes an input terminal coupled to a gate 212 of the main switch 210 and to a gate 222 of the extraction device 220, and an output terminal coupled to a drain 226 of the extraction device 220. The structure 200 further includes a ground terminal coupled to an emitter of the main switch 210. Because the gates 212, 222 of the main switch 210 and extraction device 220 are tied together, the input signal driving the gate 212 of the main switch 210 also drives the gate 222 of the extraction device 220.

Internal components of the structure 200 further include a collector 216 of the main switch as well as a source 224 of the extraction device 220, which is electrically tied to the Extraction Plug.

The extraction device 220 may be integrated on the same die as the main switch 210, or it may be a discrete device that is coupled to the main switch. In some embodiments the extraction device may be formed on a separate semiconductor substrate than the main switch 210 and is coupled to the main switch. In some embodiments the semiconductor substrate for the main switch and a semiconductor substrate for the extraction device 220 may be separate substrates but assembled together in a single package.

The structure 200 of FIG. 4A conceptually operates as indicated as in Table 2:

TABLE 2

Operational States of Main Device and Extraction Device

| Device | State | | | |
| --- | --- | --- | --- | --- |
| | Turn On | Turn Off | BVgss | BVdss |
| Main Device | On | Off | Low | High |
| Extraction Device | OFF | On | High | Low |

In operation, when the main switch 210 is ON, the extraction device 220 is OFF, and vice-versa. In device operation, i.e., when the main switch 210 is conducting, the extraction device 220 does not interfere or affect the operation of the main switch 210. In other words, the operating parameters of a main switch 210 coupled to the extraction device 220 are the same or similar as a main switch that is not coupled to an extraction device, such as the IGBT of FIG. 1. The main switch 210 has a low breakdown voltage (BVgss) between its gate and source, but a relatively high breakdown voltage (Bvdss) between the drain and the source. Conversely, the extraction device 220 has a high BVgss breakdown voltage and a relatively low BVdss breakdown voltage.

FIG. 4B is a schematic diagram of an example configuration device 240 of the structure 200 of FIG. 4A. The device 240 is in the structure of an IGBT, having a PNP transistor 250 as an injector, a P-channel MOSFET 260 functioning as the extraction device 220 of FIG. 4A, and an N-channel MOSFET 270. The MOSFETS 260 and 270 are coupled in series. The device 240 may be integrated on a single semiconductor die. In other embodiments, as described above, the P-Channel MOSFET may be formed on a separate semiconductor die and electrically connected to the N-Channel MOSFET 270.

Figure 1:
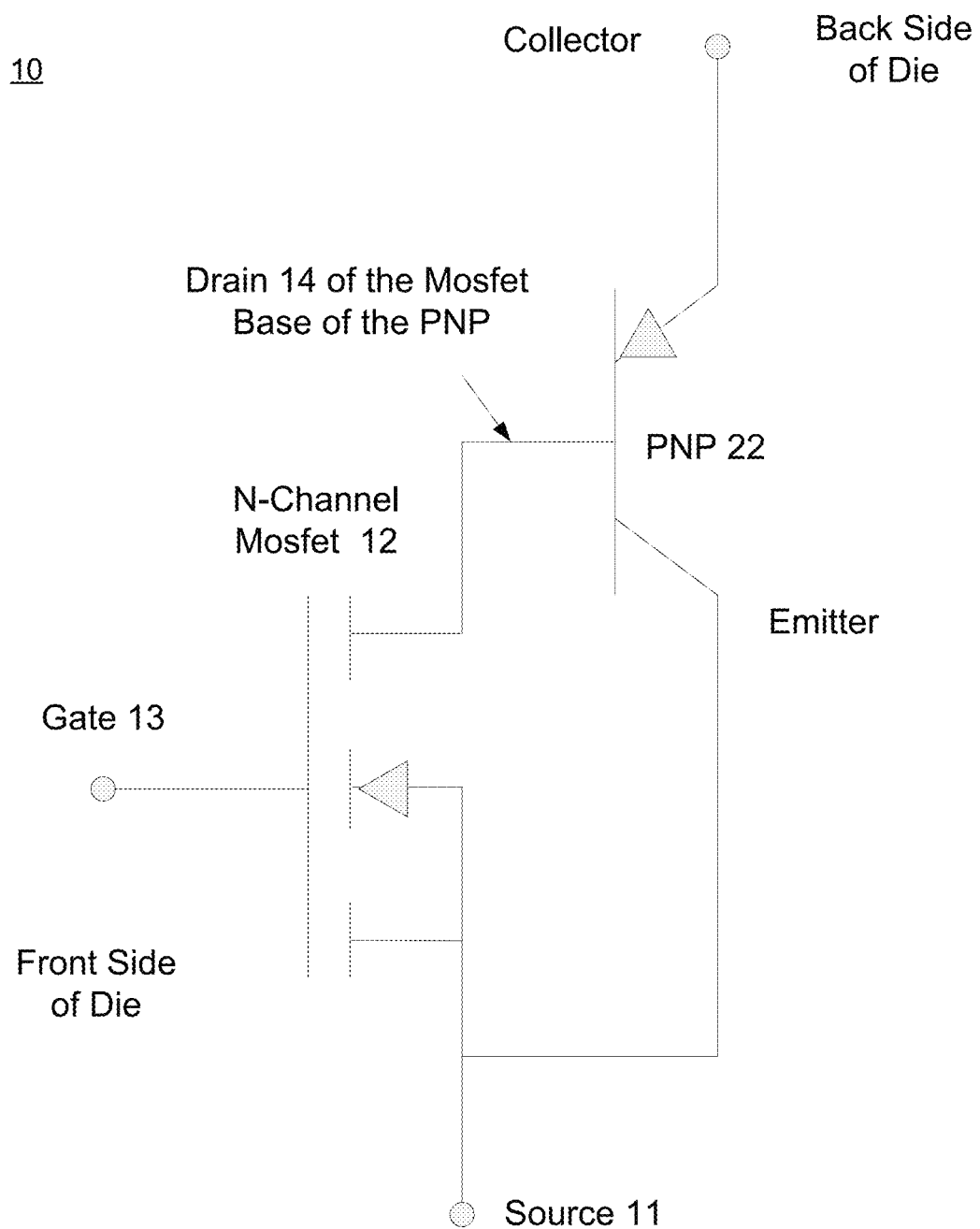
FIG. 1 is a circuit schematic drawing of a conventional IGBT having a MOSFET structure on a front side of a die and a P-N-P transistor, with its emitter as an injector, formed on the backside of the die.
Figure 2:
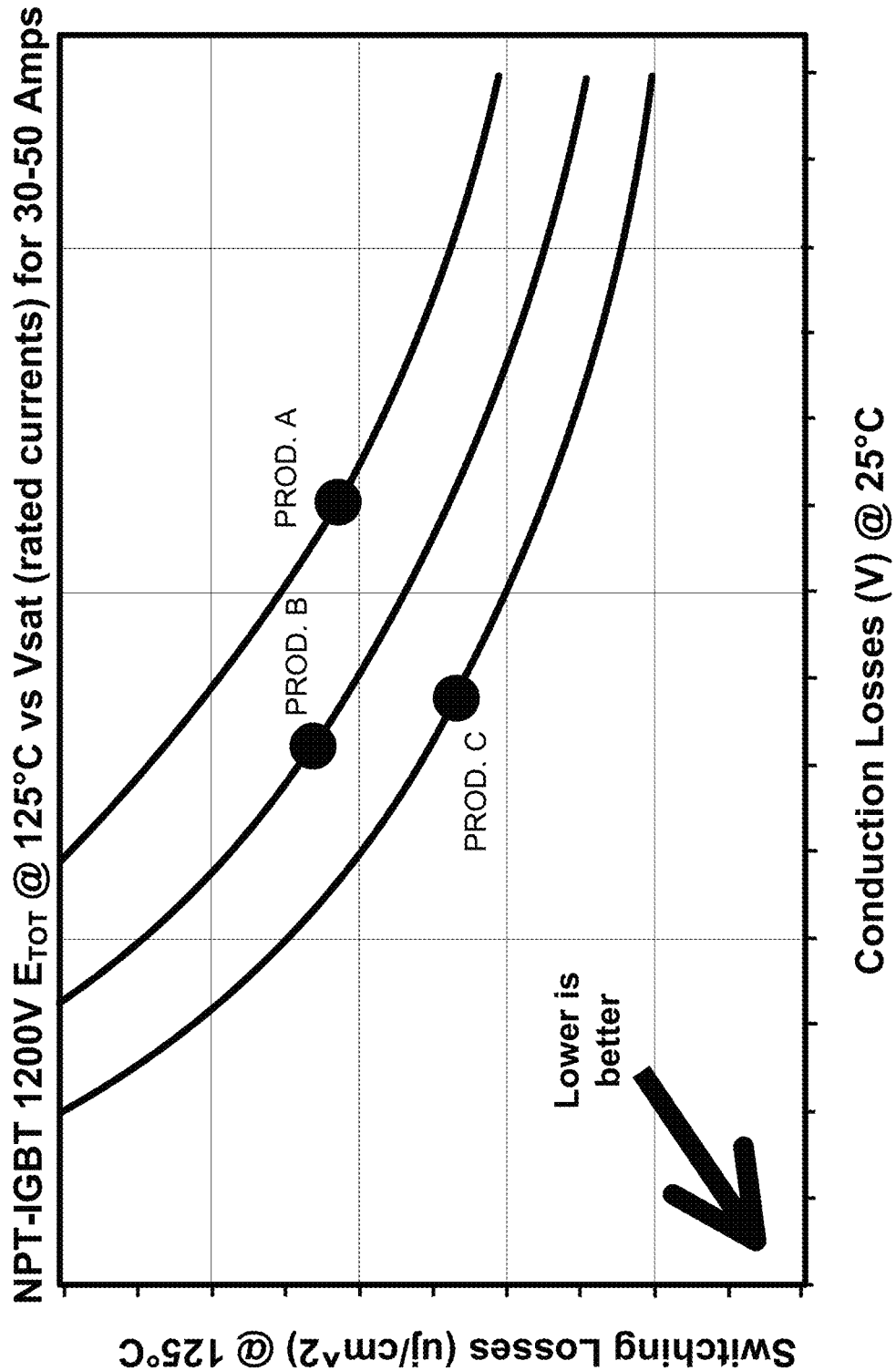
FIG. 2 is a graph generally illustrating the tradeoff between switching losses and conduction losses of conventional IGBTs.

In operation of the device 240, when the gate voltage is HIGH, the base of the PNP 250 transistor is connected to a ground at the source of the MOSFET 270, while the device 240 is conducting. Then, when the gate voltage goes LOW, to turn off the device 240, the N-channel MOSFET 270 turns OFF, while the P-channel MOSFET 260 turns ON. The P-Channel MOSFET 260 turning ON provides a path for excess charge to be removed from a drift region 280. The P-Channel MOSFET 260 is formed so that, when the gate voltage is HIGH, the P-Channel MOSFET is OFF, and turns on when the gate voltage goes LOW. At low Vgs voltages, when the main switch (IGBT) turns OFF, the P-Channel MOSFET 260 operates similar to that of a resistor, with its drain coupled to the positively bias on the collector of the PNP 250. Therefore, electrons are pulled toward the positively biased drain electrode of the P-Channel MOSFET 260, and charge is removed from the drift region at a relatively constant rate. The P-Channel MOSFET 260 provides a path for the charge, carried by electrons, to be removed from the drift layer through the positively charged drain. Recall from FIG. 1 that one of the main problems for conventional IGBT devices to switch off quickly is that there is no access to the drain 14 of the MOSFET 10 (FIG. 1). Instead, using embodiments of the invention, the extraction device, which here is the P-channel MOSFET 260, extracts excess carriers relatively quickly from the bulk drift area of the IGBT by conducting them to the collector through the P-channel MOSFET 260. This action of removing the excess charge carriers when the IGBT turns off significantly increases the turn-off time of the IGBT.

Figure 3:
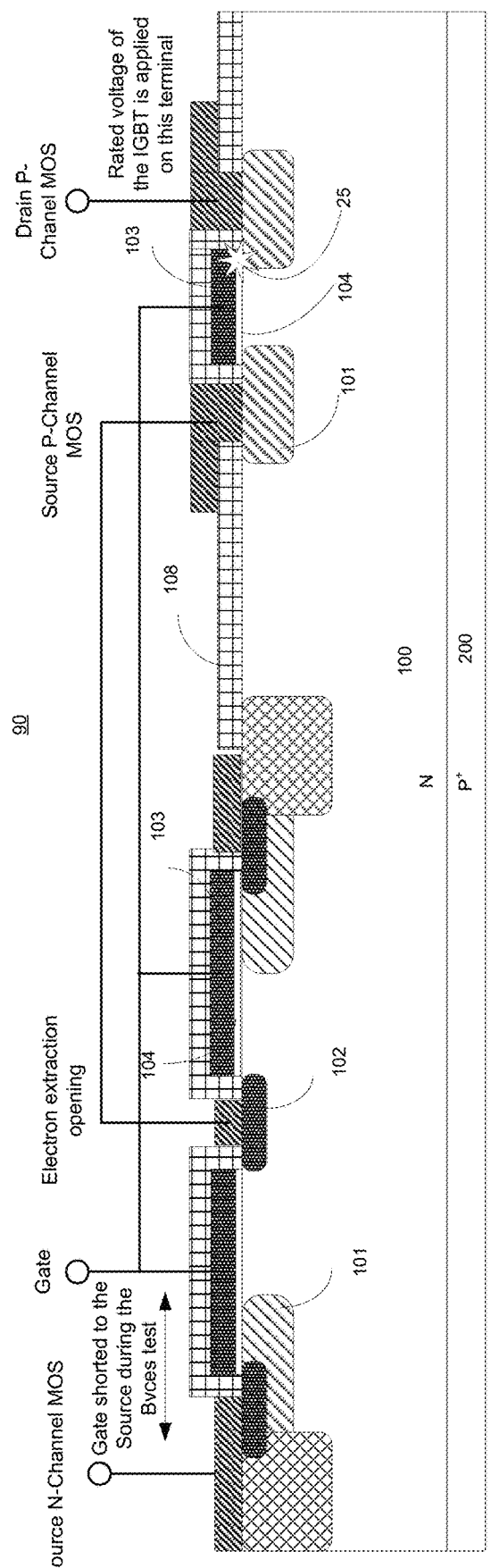
FIG. 3 is a cross-sectional diagram of a complementary IGBT as published in the Boisvert paper.

Differently from the solution illustrated in FIG. 3, however, embodiments of the invention use access elements, referred to herein as extraction terminals, Extraction Plugs, or merely plugs, to couple areas of the bulk semiconductor to the source of the P-channel MOSFET to facilitate the extraction of the excess carriers. These plugs are formed in trenches, which provide electrical access to the bulk region of the device as the main device is being turned OFF.

Figure 5:
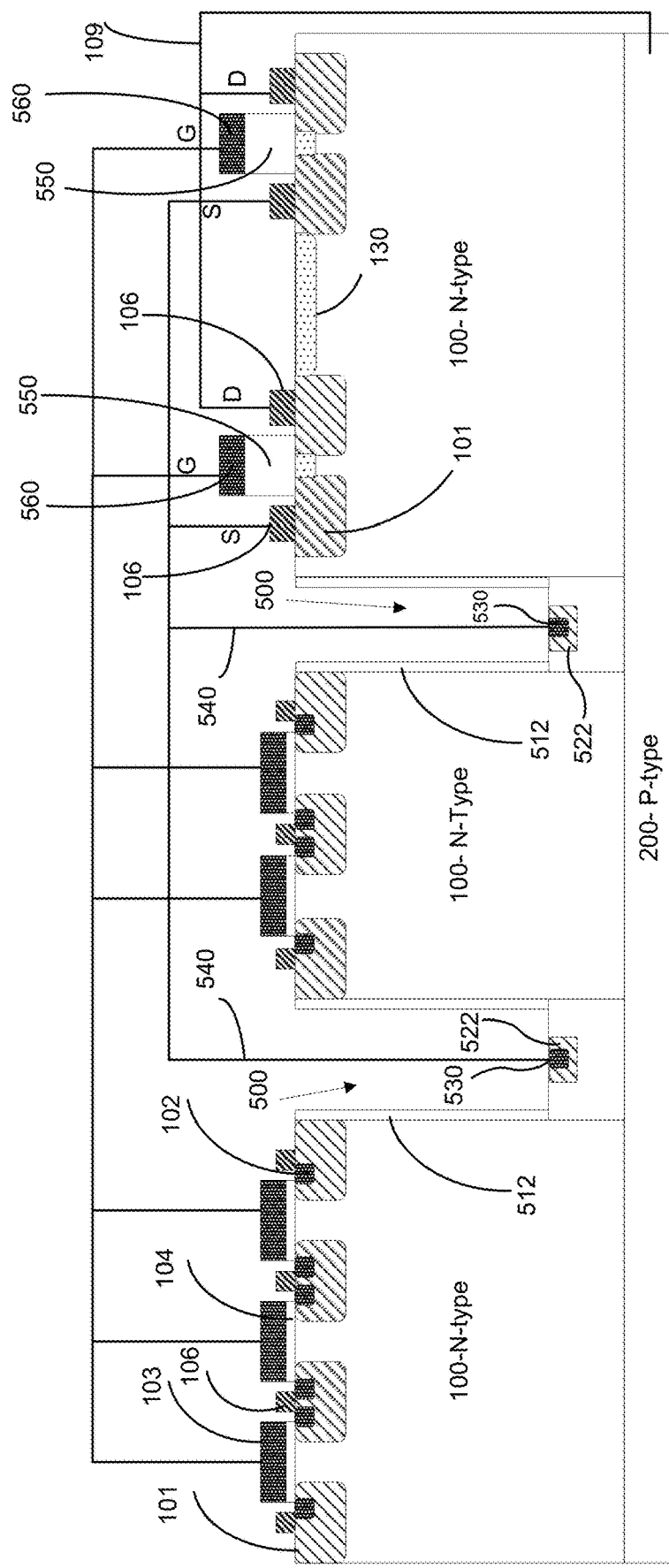
FIG. 5 is a cross sectional view of a forced extraction IGBT with Extraction Plugs of a first type and a PMOS Extraction Device, according to embodiments of the invention.

FIG. 5 is a cross-sectional view of an IGBT with Extraction Plugs, according to embodiments of the invention. In this embodiment, the Extraction Plugs are formed at the base of a deep trench, as described below.

The following legend is used with reference to the cross-sectional drawings:

Legend:

100- N-type Starting Material
101- P-type P-Well
102- N-Type Source
103- Polysilicon Gate
104- Thin Gate Oxide
105- Thick Gate Oxide
106 -Front Metal
107- Connecting Metal Traces
108- Passivation
109- Wire Bonding
110- P-Injector of the IGBT
120- Spacing between the P-Wells
130-Counter doped area 140- Oxide at the bottom of the FE-PMOS
150- N+ SiC Substrate
151- N - drift region of the 4H—SiC
160- P-Type Wells
165- Schottky Metal
170 - SiC Counter doped region
200-Anode of the FWD
210-Cathode of the FWD
201- Drain of the PMOS
202- Gate of the PMOS
203- Source of the PMOS
211- Collector of the IGBT (main switch)
212- Gate of the IGBT (main switch)
213- Emitter of the IGBT (main switch)
220- Termination area of any switch
221- Active Area of any switch (IGBT)
222- Source (or Emitter) of the Main Switch
500- trench structure
512/612- Additional dielectric (Oxynitride, Nitride)
522/622- contact region
530/630 - Extraction Plug
540- Metal Trace
550- Thick Gate Oxide
560- Gate The structure 92 of FIG. 5, which illustrates the implementation of Extraction Plugs inside of the active area of the IGBT as well as the implementation of a PMOS extraction device, generally includes several IGBT cells on the left-hand side as well as cells of PMOS extraction devices on the right-hand side. The IGBT parts of FIG. 5 are conventional, planar type, but any type of IGBT cells (trench, for example) may use embodiments of the invention. Different from standard IGBTs, however, is the inclusion of Extraction Plugs that are isolated from the main cells by deep trenches 500, formed into the drift region 100. The deep trenches 500 may be protected with an oxide layer 512. At the bottom of the trenches 500, a contact region 522 is formed, which may be N++ doped. The contact 522 provides a low resistance path to the drift region 100 area. Extraction Plugs 530 electrically couple to the contact 522, and, by extension, to the drift region 100. The Extraction Plugs 530 may be formed of metal, such as tungsten, or formed of doped polysilicon, to create an electric conductive path with the trench 500. A metal connection, such as a trace 540, electrically connects the Extraction Plugs 530 to the source of an extraction PMOS transistor. The PMOS transistor used for carrier extraction may be formed at the same time as the IGBTs. For instance, the P-well 101 of the PMOS transistors may be made at the same time as the P-wells 101 of the IGBTs, as well as other common steps. By including the deep trenches 500, which serve to isolate the Extraction Plugs 530 from the main cells of the main switch, the trench 500 blocks voltage between the main switch and the extraction device, and the blocking voltage of the main switch is not affected.

Also with reference to FIG. 5, an important distinction of the extraction PMOS included in embodiments of the invention from a standard PMOS transistor is the thickness of its gate oxide 550, which is tailored to withstand a voltage higher than the blocking voltage of the IGBT. Additional counter-doping techniques can be used to properly target the threshold voltage of the extraction PMOS. These additional implants can be local in the channel region only, or can be implanted across the entire area of the extraction PMOS. The gate 560 of the extraction PMOS can be processed at the same time as the gates of the main IGBTs. The backside of the IGBT, of P-type, 200, can have a high doping and therefore its injection efficiency can be as high as possible.

As mentioned above, the Extraction Plugs 530 may be formed of standard semiconductor materials using standard semiconductor processes. For instance, the Extraction Plugs 530 may be formed of metallic plugs, like tungsten, or with doped polysilicon, or whatever means are available in the semiconductor industry to create a conductive path on the entire depth of the trench. In some embodiments the contact 522 and the Extraction Plugs 530 are formed in the entire length of the trench 500. In other embodiments the contact 522 and Extraction Plug 530 may be formed in less than the entire length of the trench 500. In yet other embodiments, a series of individual contacts 522 and Extraction Plugs 530 may be formed within a single trench. The N++ contact 522 in the Extraction Plugs 530 are connected to the source of a PMOS transistor through the metal conductor 540.

Creating the trenches 500 is a standard semiconductor process, although trenches have never before been produced for this purpose. The depth and size of the trenches 500 may be specifically tailored to a blocking voltage of the device, so long as the N++ doped contact in the trench 500 is capable of reaching the drift region of the Vertical Mosfet where the conductivity modulation of the IGBT takes place. Further, other standard processes of semiconductor fabrication, such as doping levels, types of layers, front metal and interconnects, are design specific, and do not have to be modified from standard processes.

In FIG. 5, the gates of the IGBT and PMOS devices are electrically coupled together, and the drain of the PMOS transistors are tied to the backside of the IGBT with an external wire 109.

The threshold voltage of the PMOS transistors in FIG. 5 may be targeted to be between +1 to −3 volts, and more specifically to approximately −1 volt. The threshold voltage may be implementation specific, and determined during a device optimization phase. The breakdown voltage of the PMOS transistor (BVgss) may be between 1,000-10,000 V, for example. Since the drain-source voltage of the PMOS is always clamped to the voltage across the "injecting P-N" junction of the IGBT, there is no need for high voltage termination of the PMOS. The PMOS can be seamlessly integrated on any main switch that employs conductivity modulation, IGBT (vertical or lateral), or their variants, or other switches where bipolar conduction is used. The concept of an Extraction Device is not limited to a P-Channel Lateral Mosfet transistor, but rather extends to any type of semiconductor device that conforms to the Operational States according to Table 2.

Embodiments of the invention are also suited for lateral IGBTs (LIGBTs) for which the drain of the MOSFET is located on the top side of the semiconductor. Locating Extraction Plugs 530 in the active area of an LIGBT is seamless. Further, the PMOS extraction device may be formed on the same LIGBT die or outside of such a die, as a discrete element, provided that the PMOS extraction device is fabricated according to the disclosures herein.

Figure 6:
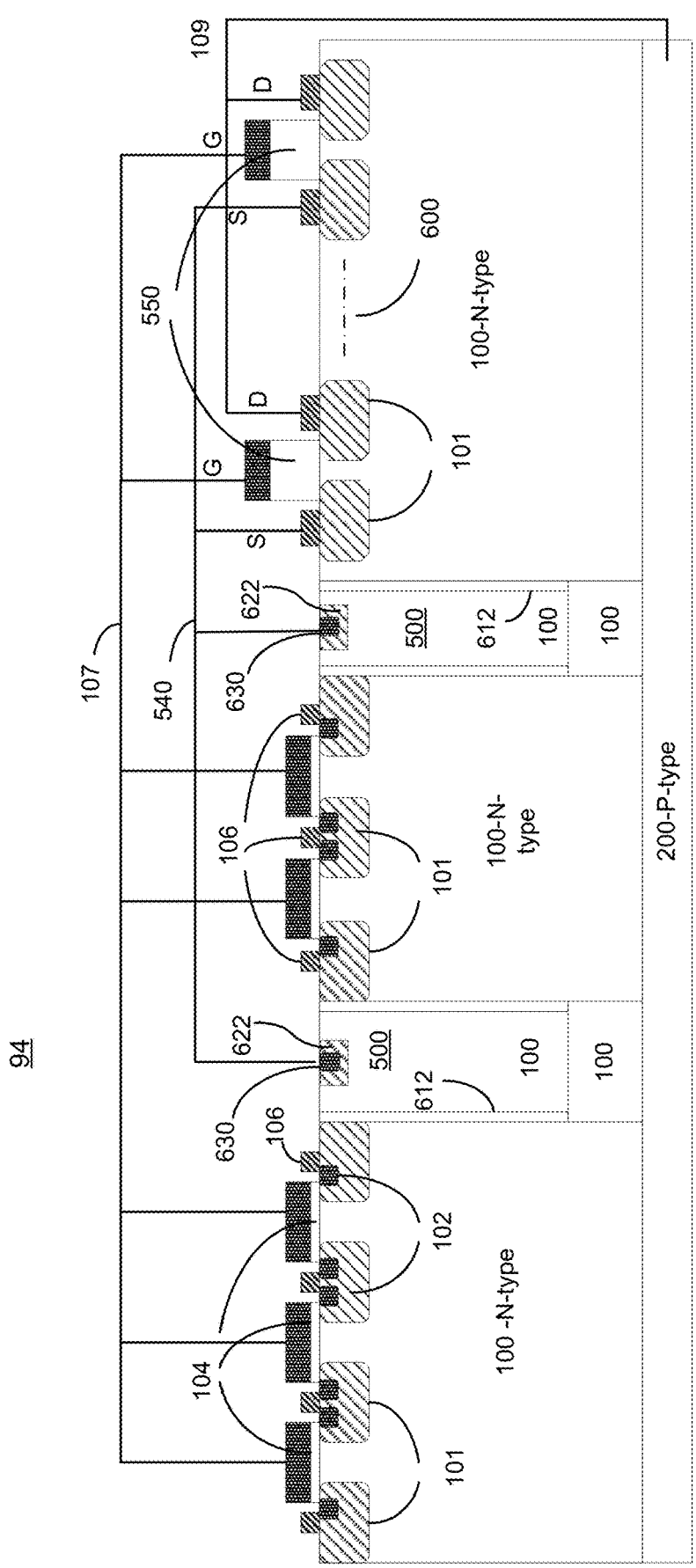
FIG. 6 is a cross sectional view of a forced extraction IGBT with Extraction Plugs of a second type and a PMOS Extraction Device, according to embodiments of the invention.

FIG. 6 illustrates another embodiment of an IGBT having a coupled extraction device in a combined device 94. The main difference between the embodiments of FIG. 5 and FIG. 6 is that the contact areas 622 and Extraction Plugs 630 in FIG. 6 are located at the top surface of the die. Isolation oxide 612 protects the contact areas 622 and Extraction Plugs 630 from the other side of the trenches. Similar to the device illustrated in FIG. 5, the Extraction Plugs 630 are electrically connected to the PMOS extraction device through a metallization line 540 or other electrically connective method. As with the device 90 of FIG. 5, the gate oxide 550 of the extraction PMOS of the device 94 is tailored such that the dielectric strength of this oxide is higher than the voltage rating of the IGBT.

Figure 7A:
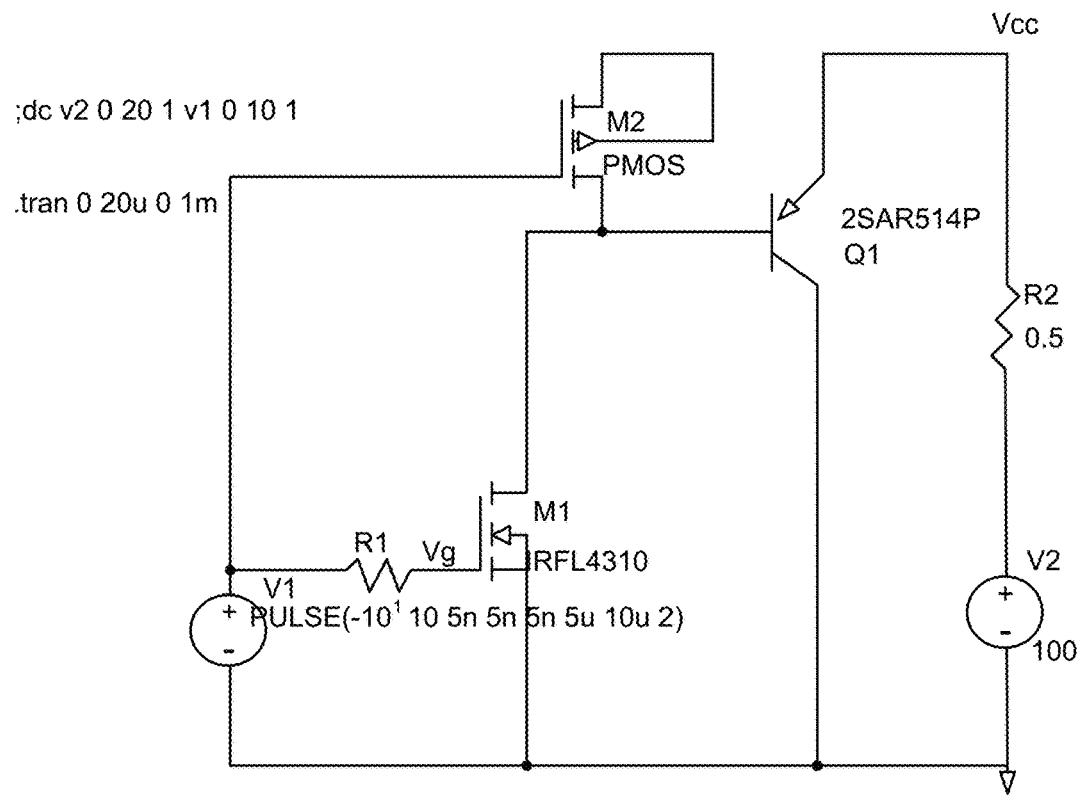
FIG. 7A is a simulation circuit for a standard, conventional, IGBT.
Figure 7B:
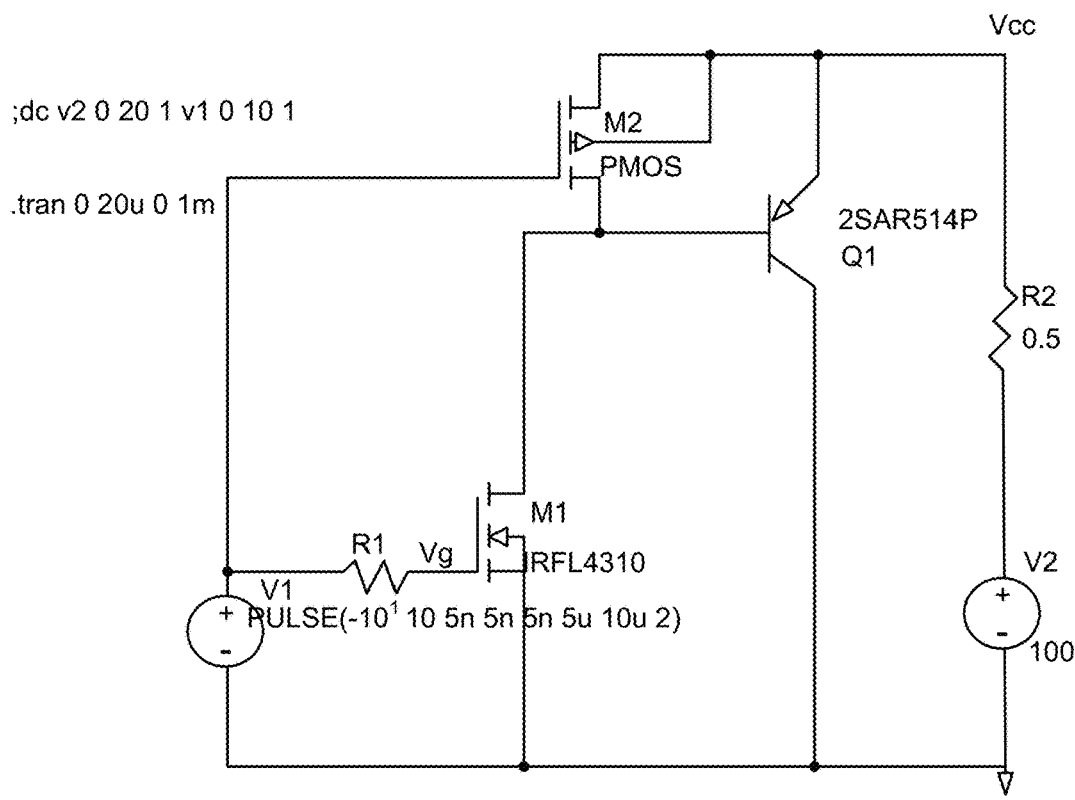
FIG. 7B is a simulation circuit of an IGBT with an extraction device according to embodiments of the invention.

FIGS. 7A and 7B illustrate schematic modeling diagrams used for generating SPICE simulations of embodiments of the invention. An N-channel MOSFET M1 (IRFL4310) and a PNP transistor Q1 (2SAR514P) appears in both simulation circuits. The PNP transistor Q1 operates as the injector. Note that a PMOS M2 is connected to the PNP transistor Q1 in FIG. 7B, but is disconnected from the PNP transistor Q1 in FIG. 7A. This is because the PMOS transistor M2 operates as the extraction device according to embodiments of the invention. Gates of the NMOS M1 and PMOS M2 are electrically tied together. By testing two nearly identical circuits, with the only difference being the presence of the PMOS transistor M2, operating as the extraction device, the efficiency of the extraction device can be tested and visualized.

In FIG. 7B, the PMOS M2 is configured to operate as an extraction device, as described above. The drain of the PMOS M2 is connected to the "drain" of the NMOS M1 (and also to the base of the PNP transistor Q1). The source of the PMOS M2 is connected to the output terminal of the entire device, which is the emitter of the PNP transistor Q1.

Figure 8A:
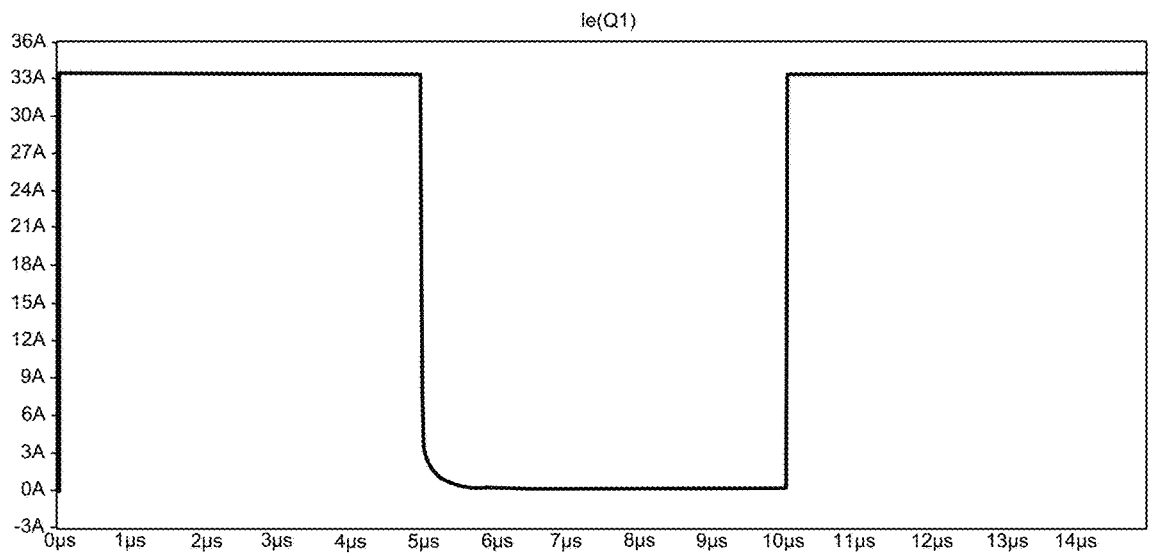
FIG. 8A is a waveform diagram illustrating an output drain current of the standard IGBT of FIG. 7A at turn-off.
Figure 8B:
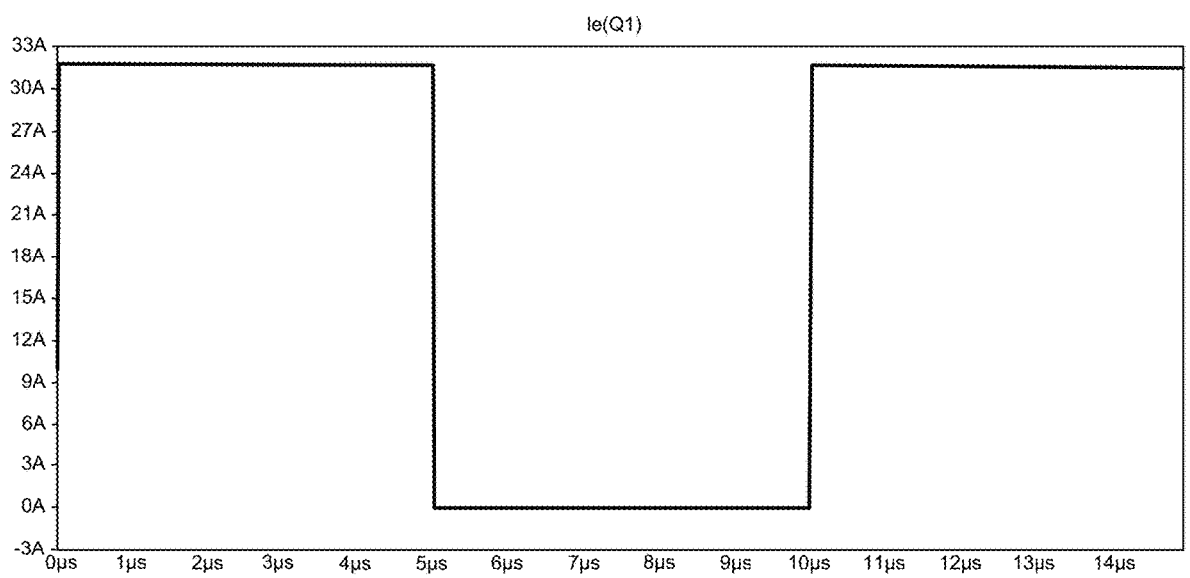
FIG. 8B is a waveform diagram illustrating an output drain current of the IGBT of FIG. 7B, according to embodiments of the invention, at turn-off.

SPICE Simulations using the circuits as illustrated in FIGS. 7A and 7B confirm the validity of the concept of using an extraction device to remove charge carriers after IGBT turn-off. FIG. 8A is an output graph of drain current waveform of the circuit, which is also the collector current when the extraction device is not connected, i.e., that of FIG. 7A, while FIG. 8B is an output graph of the drain current of the circuit of FIG. 7B, in which the extraction device is connected and operates to extract charge carriers after the IGBT turns off. With reference to FIGS. 8A and 8B, it is plain to see that the drain current drops off much quicker in FIG. 8B, which uses the extraction device, compared to the FIG. 8A, which does not use the extraction device. Indeed, the drain current illustrated in FIG. 8A continues to exhibit the long current tail known to negatively affect traditional IGBT operation, while the drain current illustrated in FIG. 8B exhibits no such tail.

Figure 9:
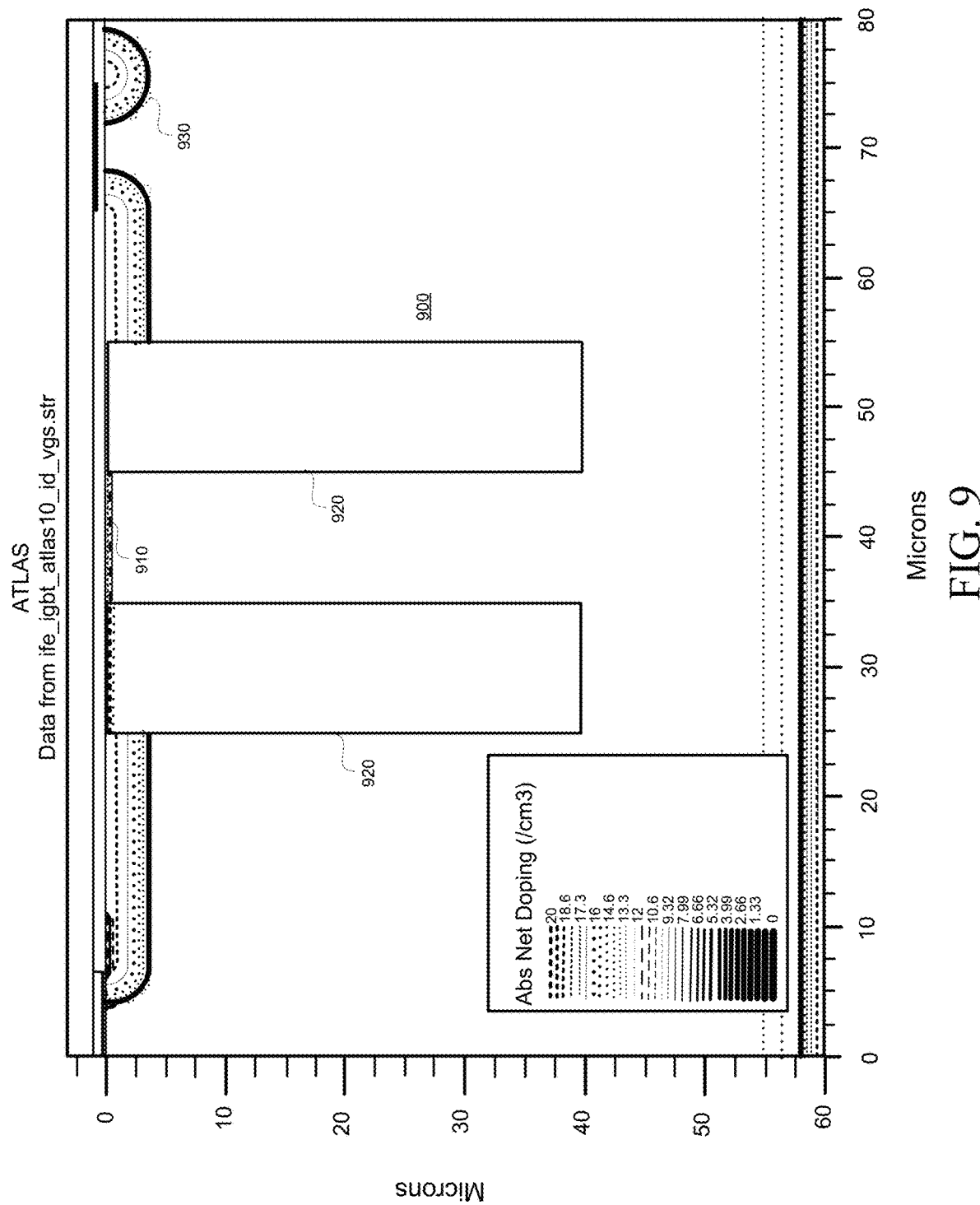
FIG. 9 is a Technology Computer Aided Design (TCAD) illustration of a model used to test and confirm operation of embodiments of the invention.

FIG. 9 is a Technology Computer Aided Design (TCAD) illustration 900 of a model used to test and confirm operation of embodiments of the invention. It should be noted that all of the SPICE, TCAD, and other simulations described herein merely prove the validity of the concept, and particular doping levels, depths, sizes, etc., of the device according to embodiments of the invention may and should be optimized for the particular device being created. The illustration 900 includes a doping profile of an IGBT structure with an Extraction Plug 910 between two deep trenches 920. The model further includes a P-Channel Mosfet 930 with thick gate oxide on the right side. P-Wells of the IGBT and the source and drain regions of the PMOS 930 are made during the same process steps, implant and diffusion, while the N++ contact of the Extraction Plug electrode 910 is made during the same process step as the source implant and diffusion of the IGBT. The depth of trenches or the width of the Extraction Plug are not necessarily optimized in this design, but rather shown here just as a proof of concept.

Figure 10:
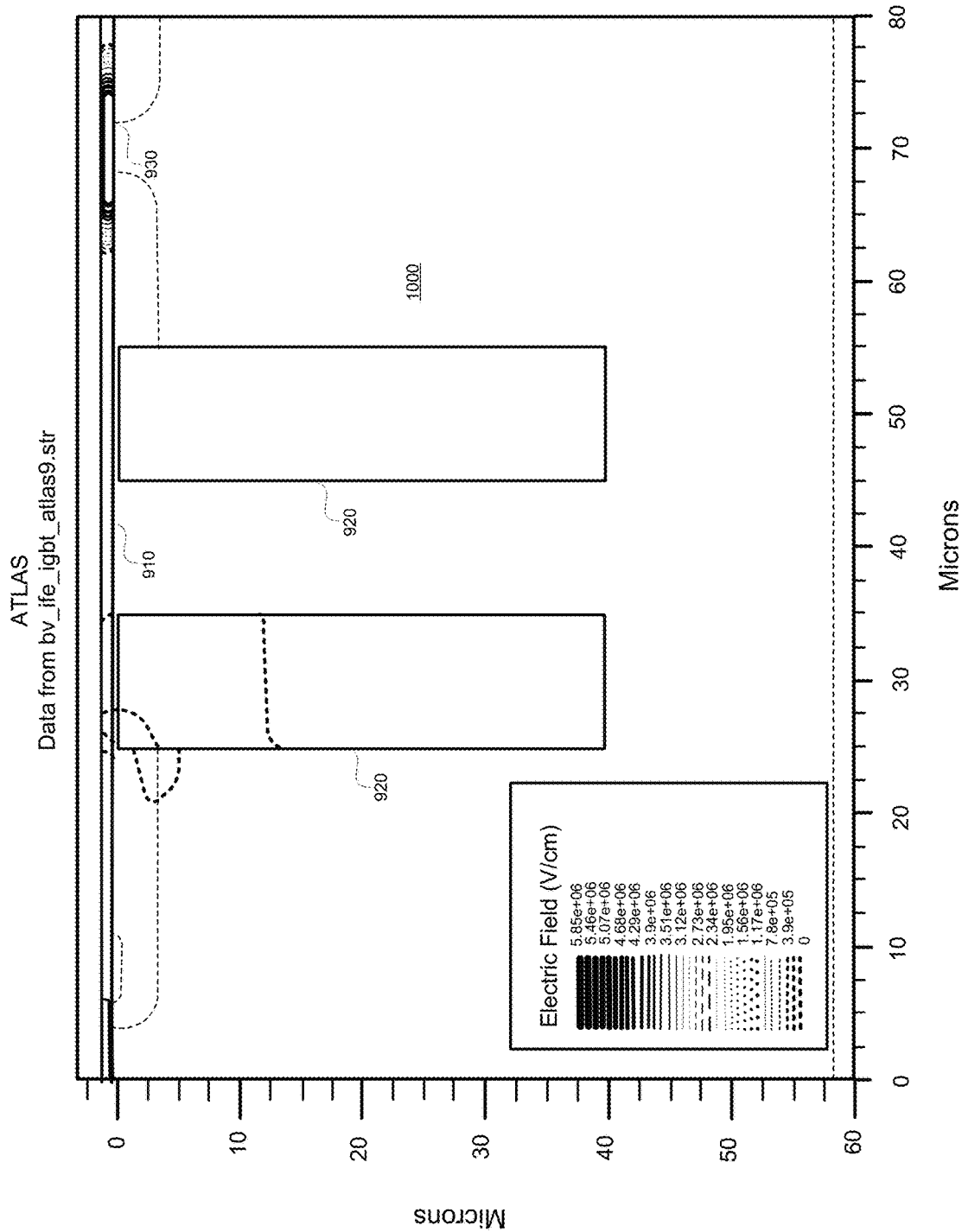
FIG. 10 is a TCAD design of the IGBT illustrated in FIG. 9 that shows strength of electric fields during operation of the IGBT during the avalanche portion of operation, according to embodiments of the invention.

FIG. 10 is a TCAD design 1000 of the IGBT illustrated in FIG. 9 that shows strength of electric fields during operation of the IGBT during the avalanche portion of operation. Note that there is a relatively high electric field across the gate oxide of the PMOS 930 when the IGBT is in avalanche mode, therefore the need for thick oxide layer when forming the PMOS 930 is justified.

Figure 11:
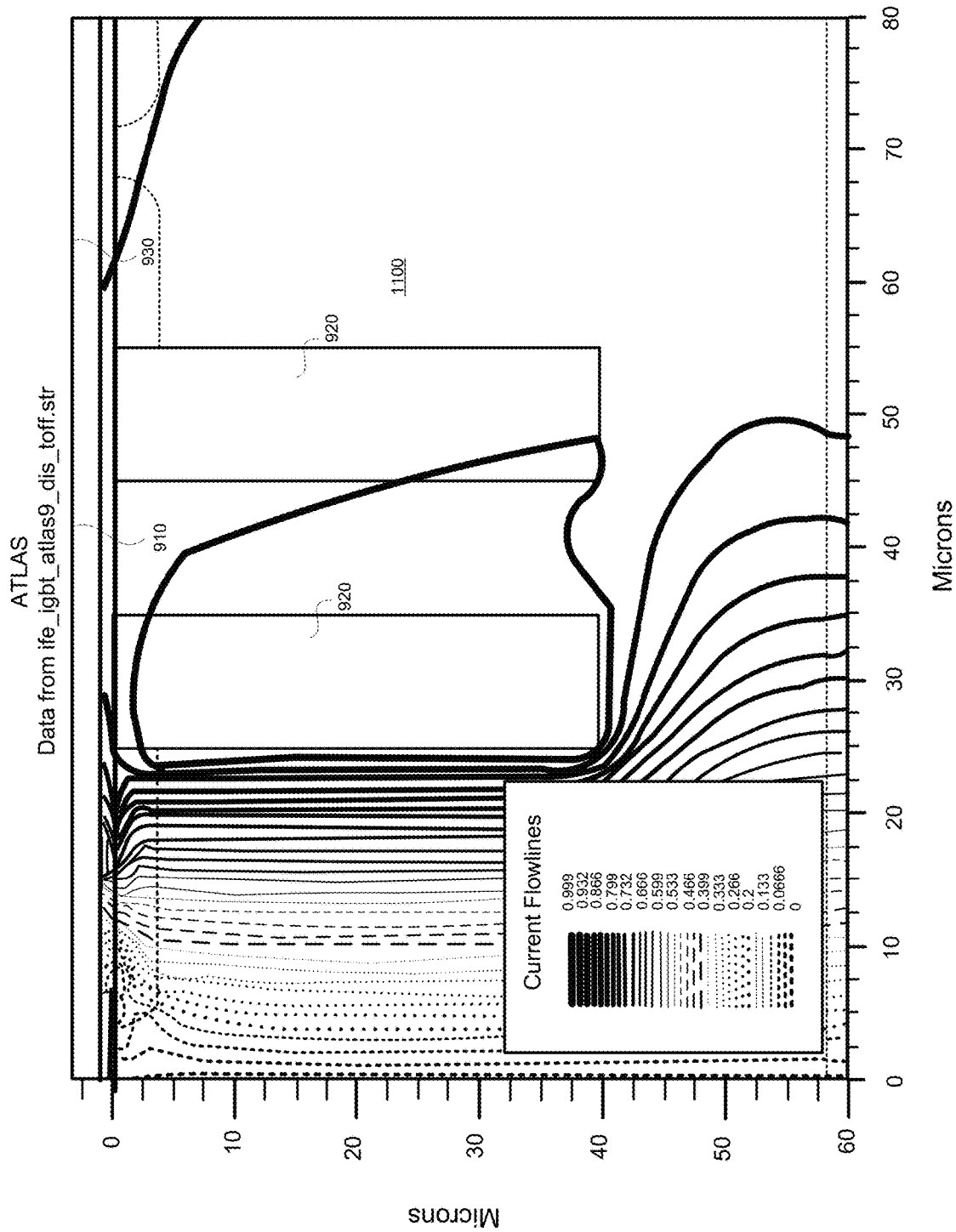
FIG. 11 is a TCAD design of the IGBT illustrated in FIG. 9 that shows electrical current flow lines of the IGBT of FIG. 9 during turn-off of the IGBT when the extraction device according to embodiments of the invention is separated from the IGBT.

FIG. 11 is a TCAD design 1100 of the IGBT illustrated in FIG. 9 that shows electrical current flow lines of the IGBT of FIG. 9 during turn-off of the IGBT. In this simulation, the extraction electrode 910 and the PMOS 930 are electrically disconnected from the IGBT. Note that the current flow lines congregate toward the main IGBT, to the left of the left-most deep trench 920. In other words, the trench structures 920 act as a current block.

Figure 12:
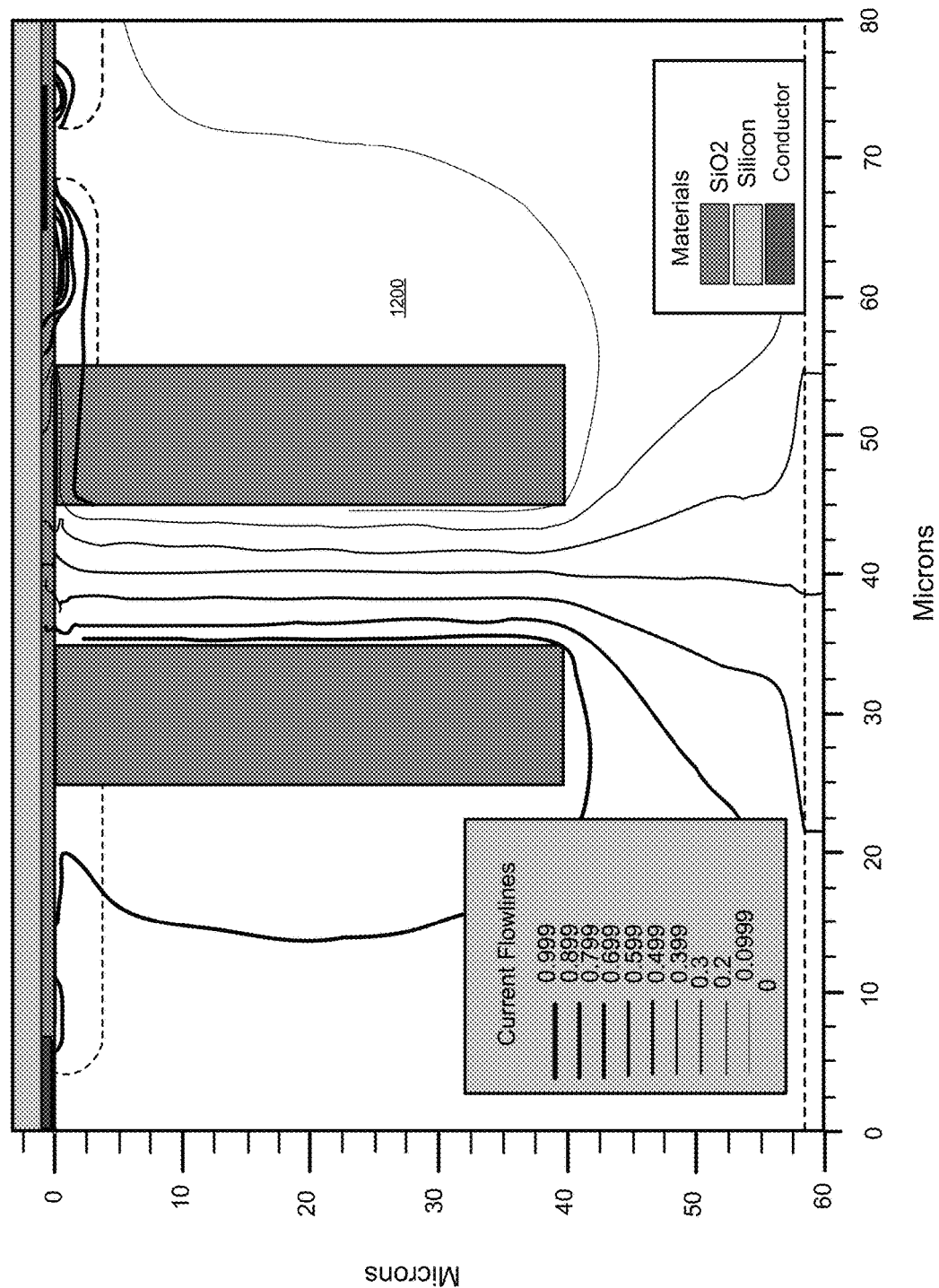
FIG. 12 is a TCAD design of the IGBT illustrated in FIG. 9 that shows electrical current flow lines of the IGBT of FIG. 9 during turn-off of the IGBT when the extraction device according to embodiments of the invention is electrically connected to the IGBT.

FIG. 12 is a TCAD design 1200 of the IGBT illustrated in FIG. 9 that shows electrical current flow lines of the IGBT of FIG. 9 during turn-off of the IGBT. Differently than the simulation illustrated in FIG. 11, the extraction electrode 910 and PMOS 930 are electrically connected to the main IGBT in this simulation. Note that the flow lines congregate toward the Extraction Plug 910, as well as within the PMOS 930, as the carriers are extracted during turn-off, causing current flow. The current flows through the extraction PMOS device 930 and into the main drain electrode of the extraction device, illustrating the main concept of increased performance of an IGBT having an extraction plug and extraction device.

Figure 13:
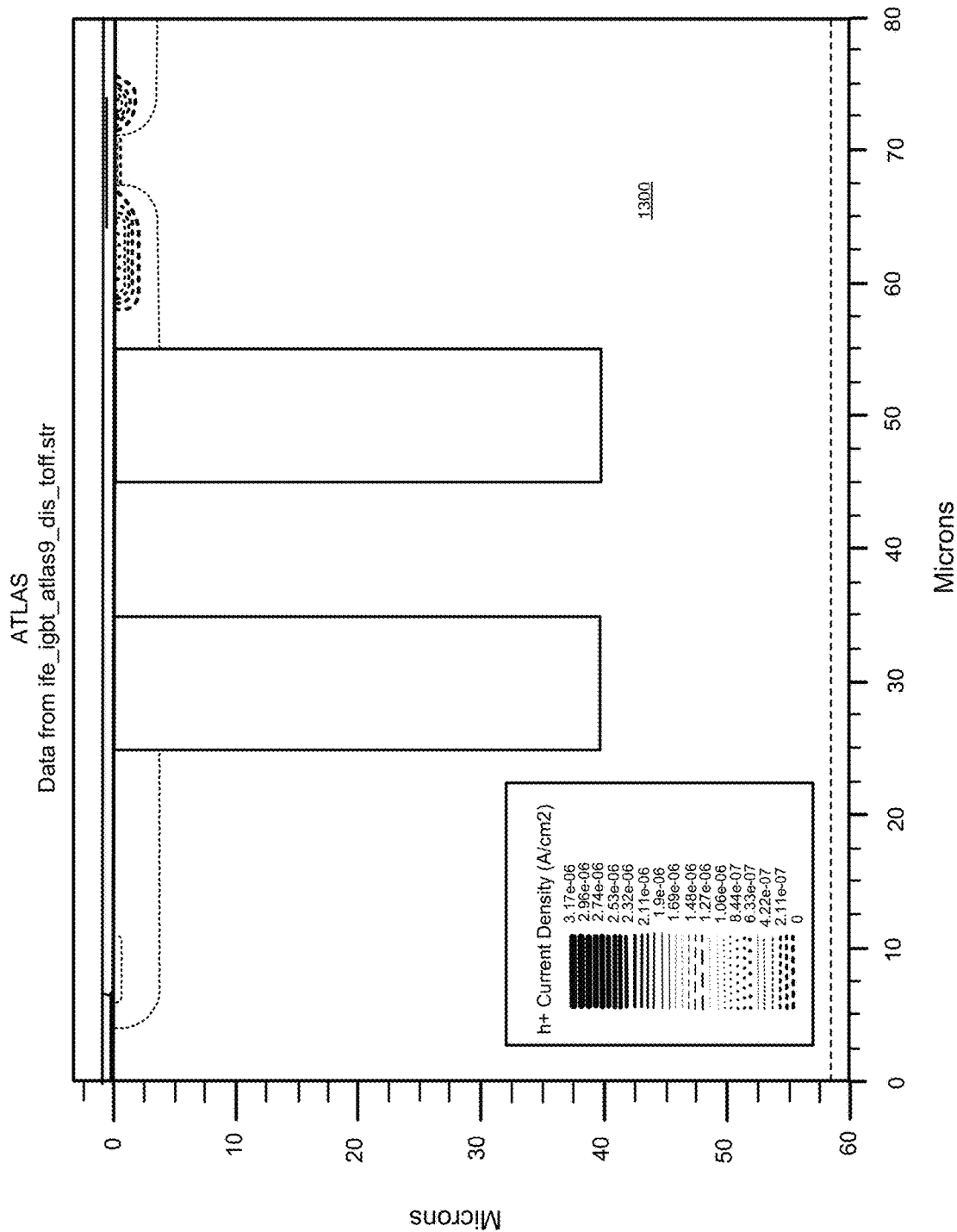
FIG. 13 is a TCAD design of the IGBT illustrated in FIG. 9 that shows electrical current density of holes during the time when the PMOS 930 is turned ON, and the IGBT is turning OFF, according to embodiments of the invention.

FIG. 13 is a TCAD design 1300 of the IGBT illustrated in FIG. 9 that shows electrical current density of holes during the time when the PMOS 930 is turned ON, and the IGBT is turning OFF. This simulation illustrates that the PMOS 930 provides a path, through the ON resistance of the PMOS 930, for the electrons to be removed from the drift region of the IGBT during turn-off phase of the IGBT.

Figure 14A:
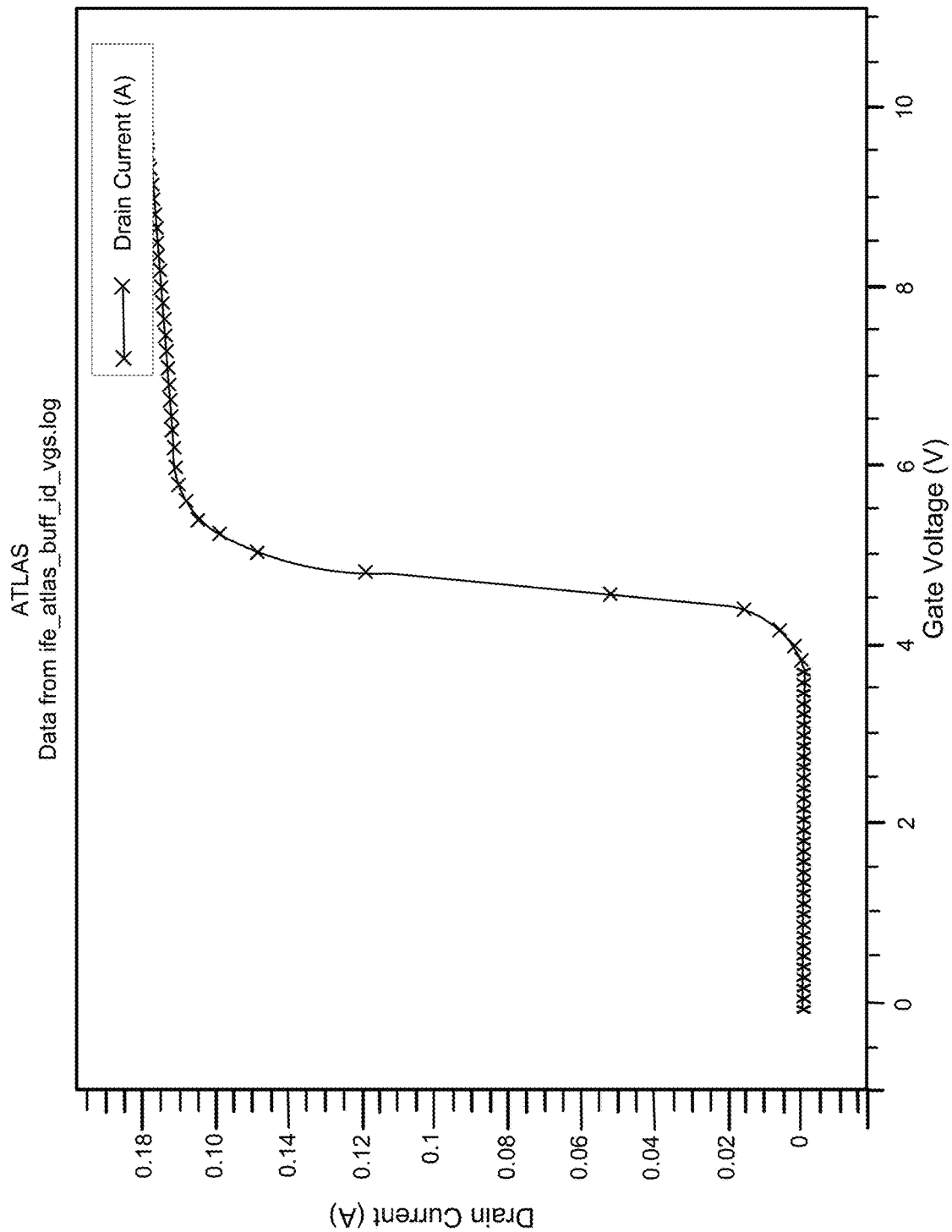
FIGS. 14A, 14B, and 14C are graphs illustrating test outputs of main Direct Current (DC) parameters of models of IGBTs having deep trenches and a PMOS extraction device according to embodiments of the invention.
Figure 14B:
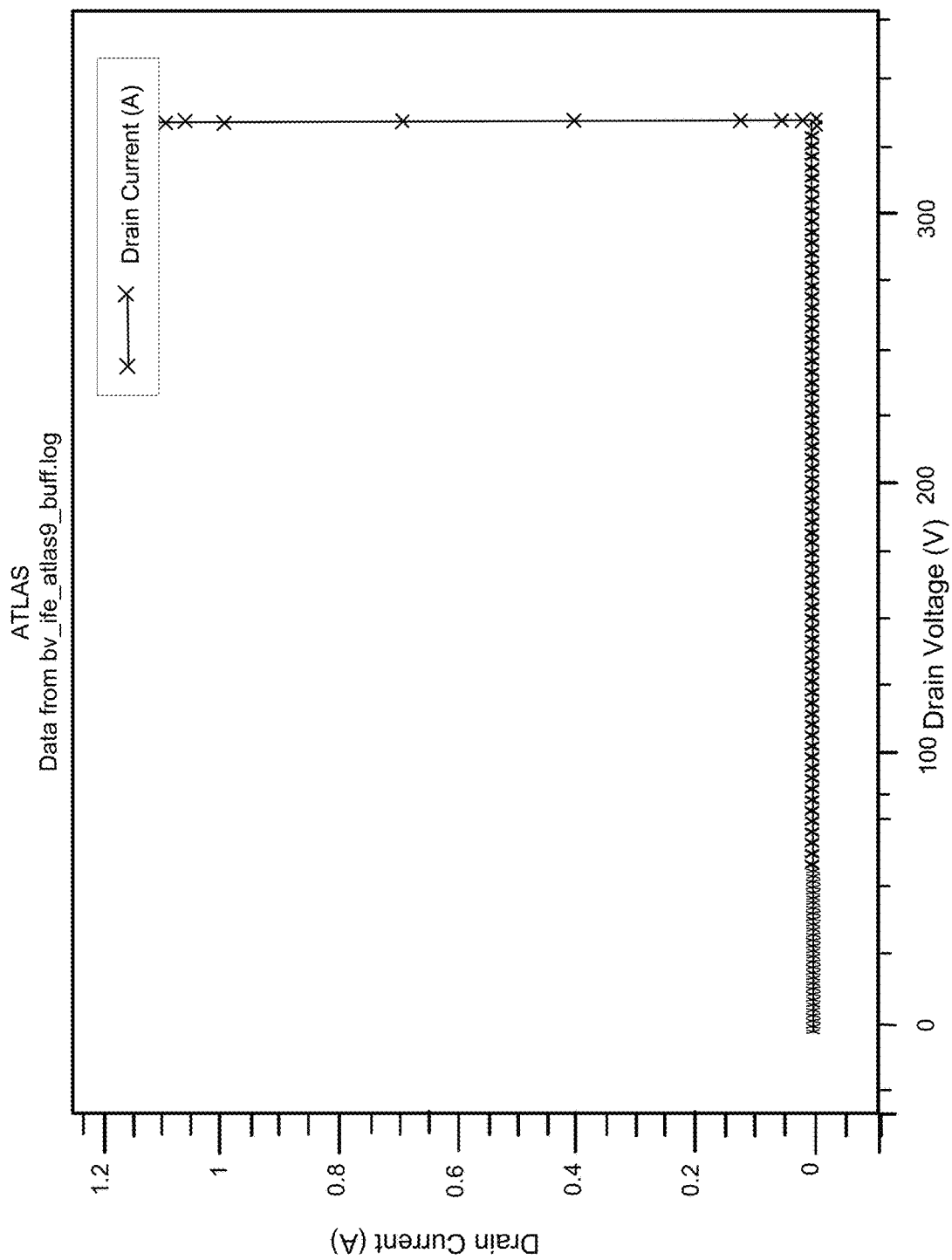
Figure 14C:
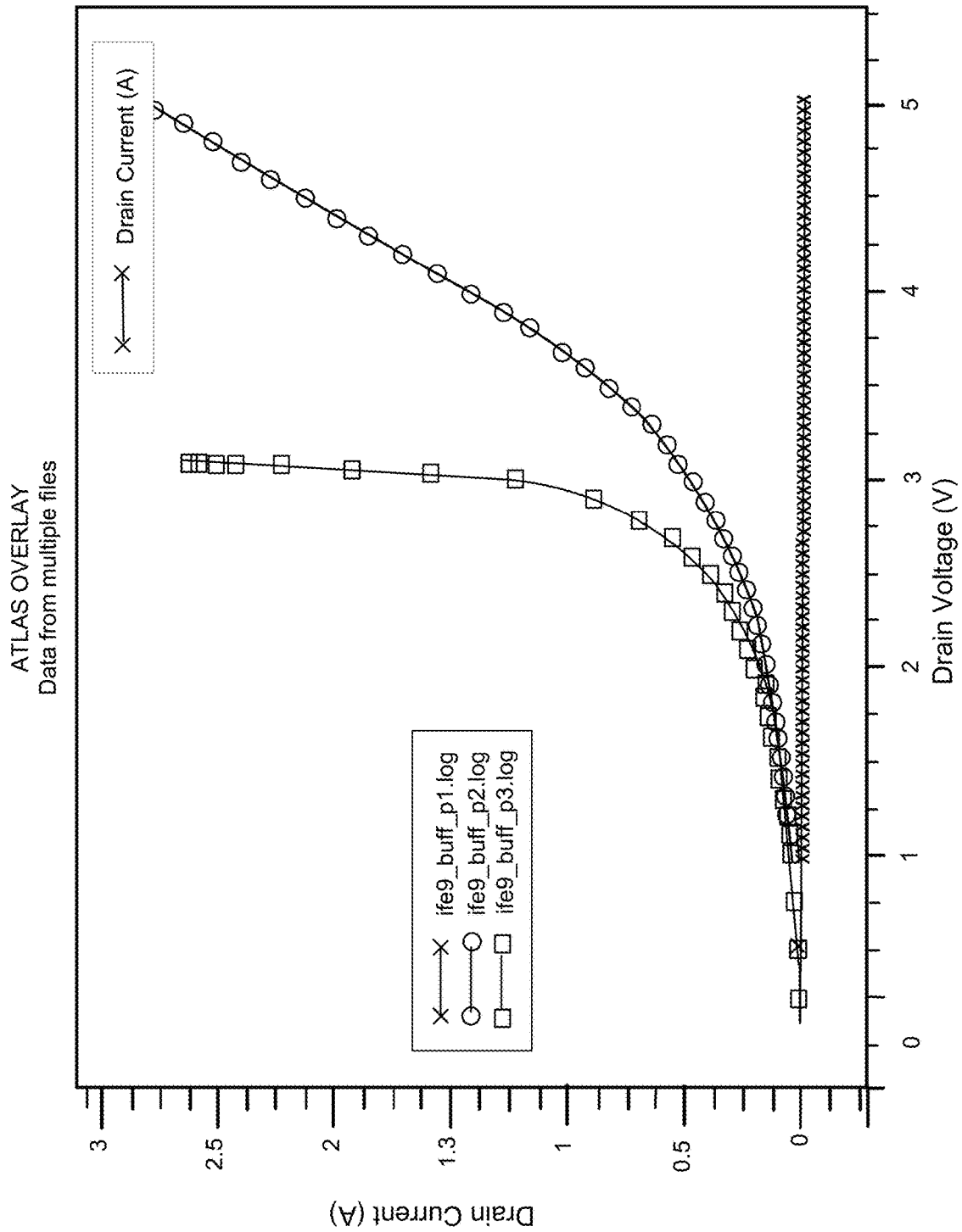

FIGS. 14A, 14B, and 14C are graphs illustrating test outputs of main Direct Current (DC) parameters of models of IGBTs having deep trenches and a PMOS extraction device. FIG. 14A is a current vs. voltage graph that illustrates a threshold turn-on voltage (Vth) of the IGBT device is normal for IGBT devices, and is not negatively affected by presence of the PMOS extraction device, such as the PMOS illustrated in FIG. 5. FIG. 14B is a current vs. voltage graph that illustrates a breakdown voltage of the IGBT in a device, such as the device 90 of FIG. 5 does not change with the presence of a PMOS extraction device. In this case the IGBT breakdown voltage is only 300 volts, and is not fully optimized, but shown here just as an illustration. FIG. 14C is a current vs. voltage graph that illustrates output characteristics of an IGBT made according to embodiments of the invention. The different graph traces of FIG. 14C represent the output characteristics of the IGBT device when the IGBT is turned ON, i.e., when the PMOS is in the OFF state. These graphed results indicate that the regular operation of the IGBT is unaffected even with the presence of the extraction plugs and the extraction device.

Figure 15:
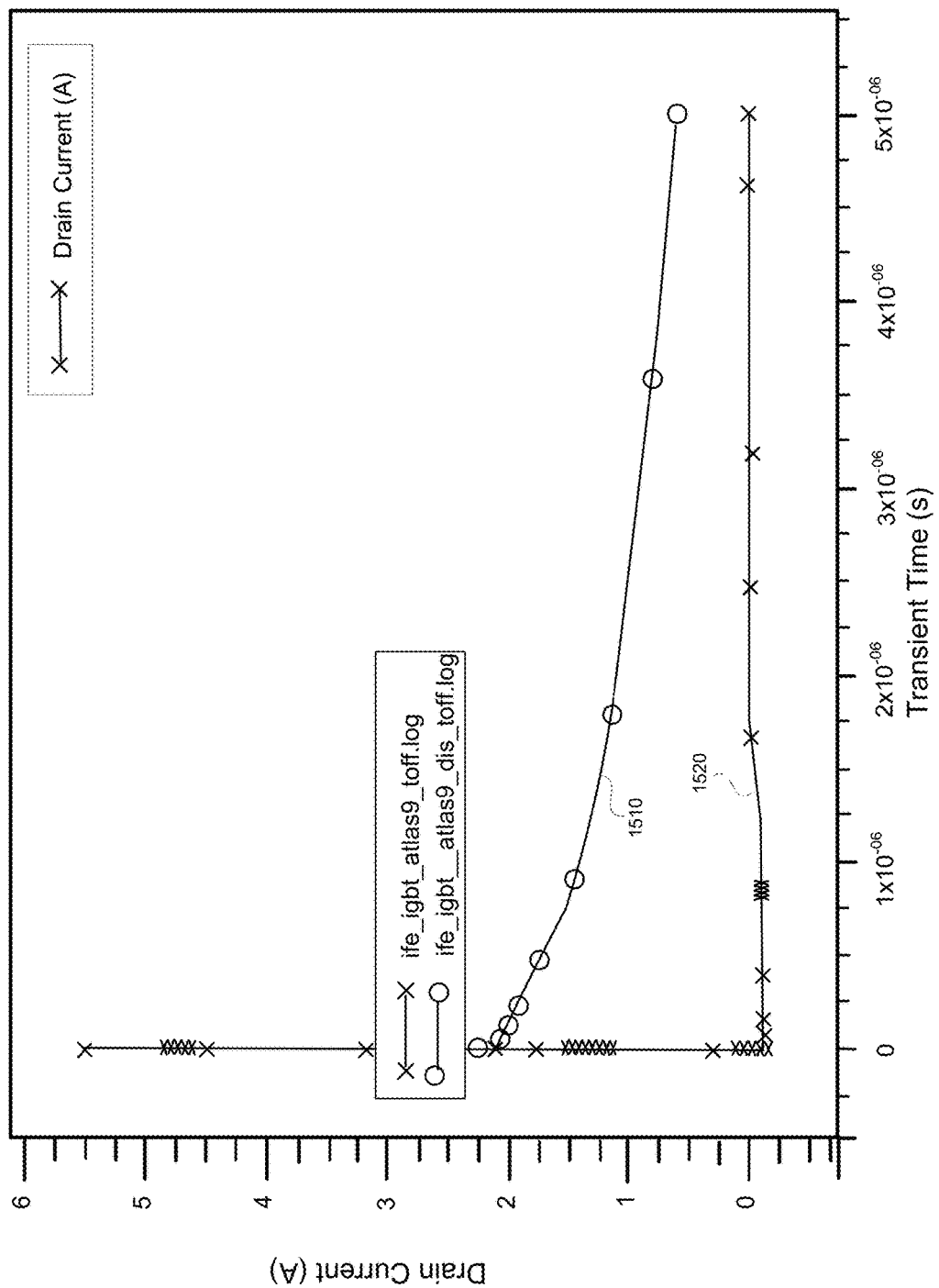
FIG. 15 is a current vs time graph that illustrates drain current, which is also collector current, during turn-off of an IGBT made according to embodiments of the invention as well as a conventional IGBT.

FIG. 15 is a current vs time graph that illustrates drain current, which is also collector current in the case of an IGBT, during turn-off of an IGBT made according to embodiments of the invention having deep trenches and an extraction device. A trace 1510 illustrates the turn off time for the IGBT in which the extraction device is disconnected from the IGBT, while a trace 1520 illustrates the turn off time for the IGBT when the extraction device is connected and operational during the IGBT turn-off. Note that the trace 1520 illustrates that the drain current from the IGBT falls off nearly immediately after turn-off, while the trace 1510 illustrates the long current tail of conventional IGBTs.

Figure 16:
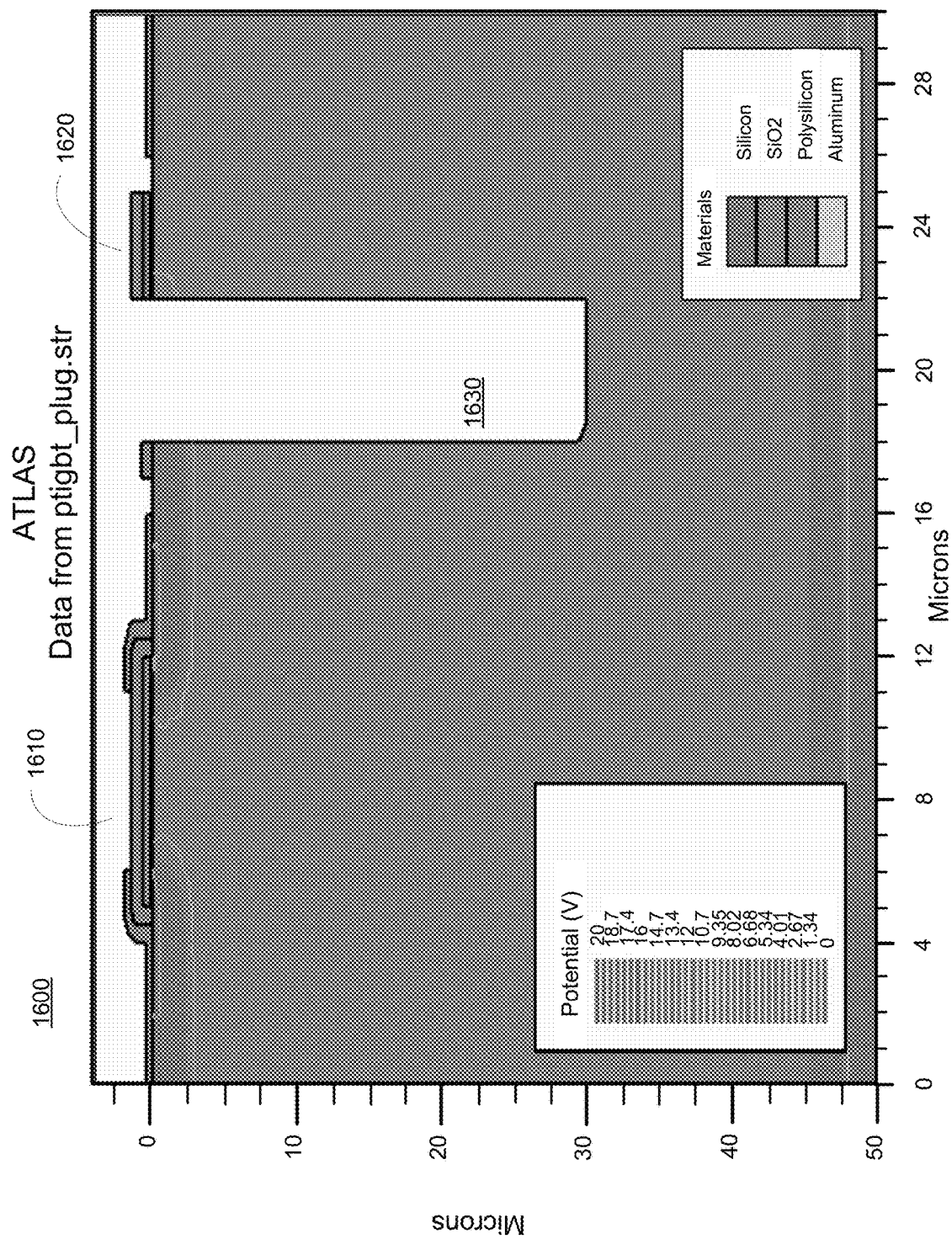
FIG. 16 is a cross sectional view of a simulated device including an IGBT that is isolated from an Extraction Plug according to embodiments of the invention.
Figure 17:
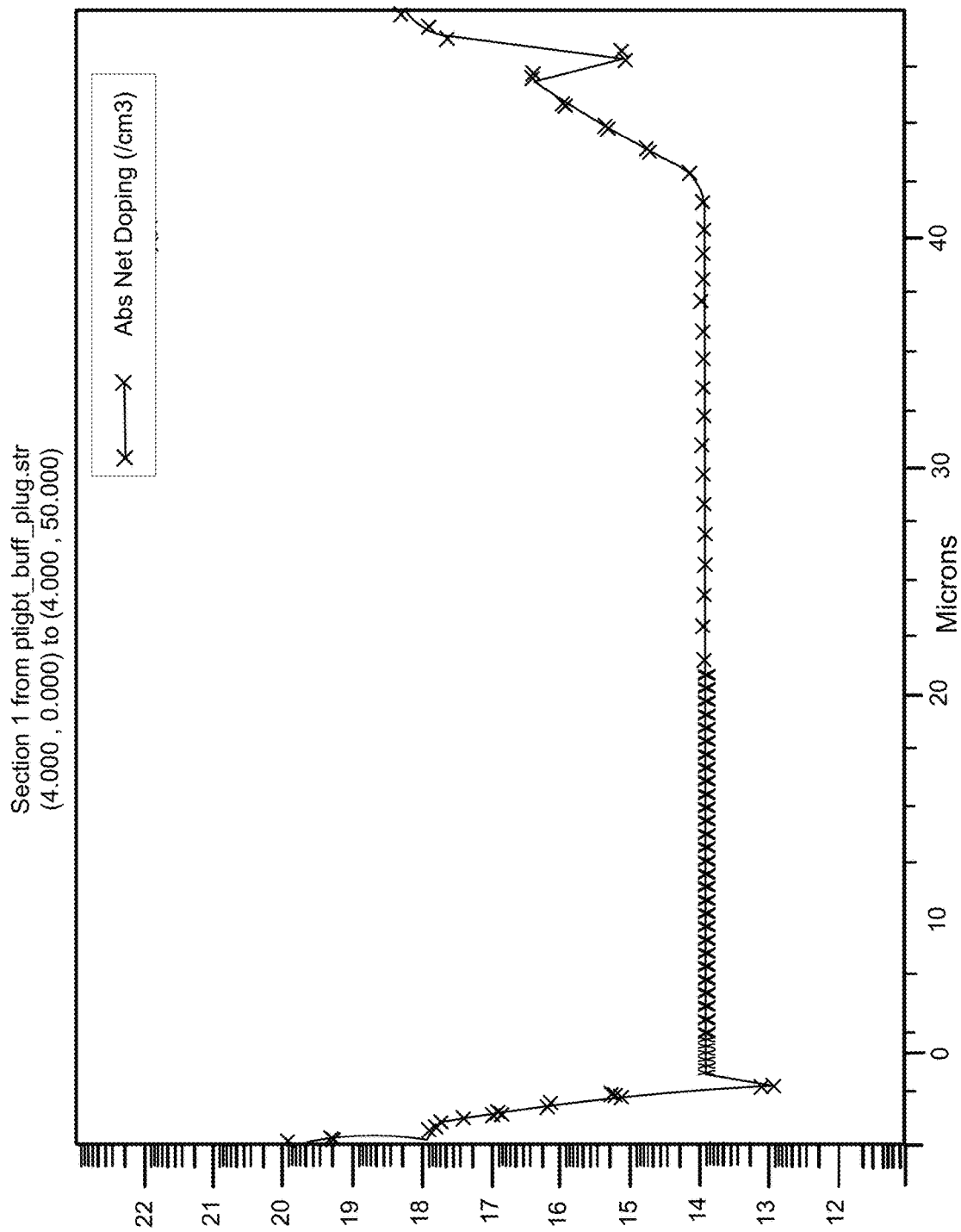
FIG. 17 is a graph illustrating the vertical doping of the device of FIG. 16.

FIG. 16 is a simulated cross sectional view of a device 1600 including a PT-IGBT 1610 that is provided with an Extraction Plug 1620. In this cross-section, the isolation structure is a deep trench 1630. The vertical doping for a portion the device 1600 (at 4 microns) is illustrated in FIG.

17, and shows the top side doping of the P-Well, source and buffer layer, and the injector doping of the PT-IGBT 1610.

Figure 18:
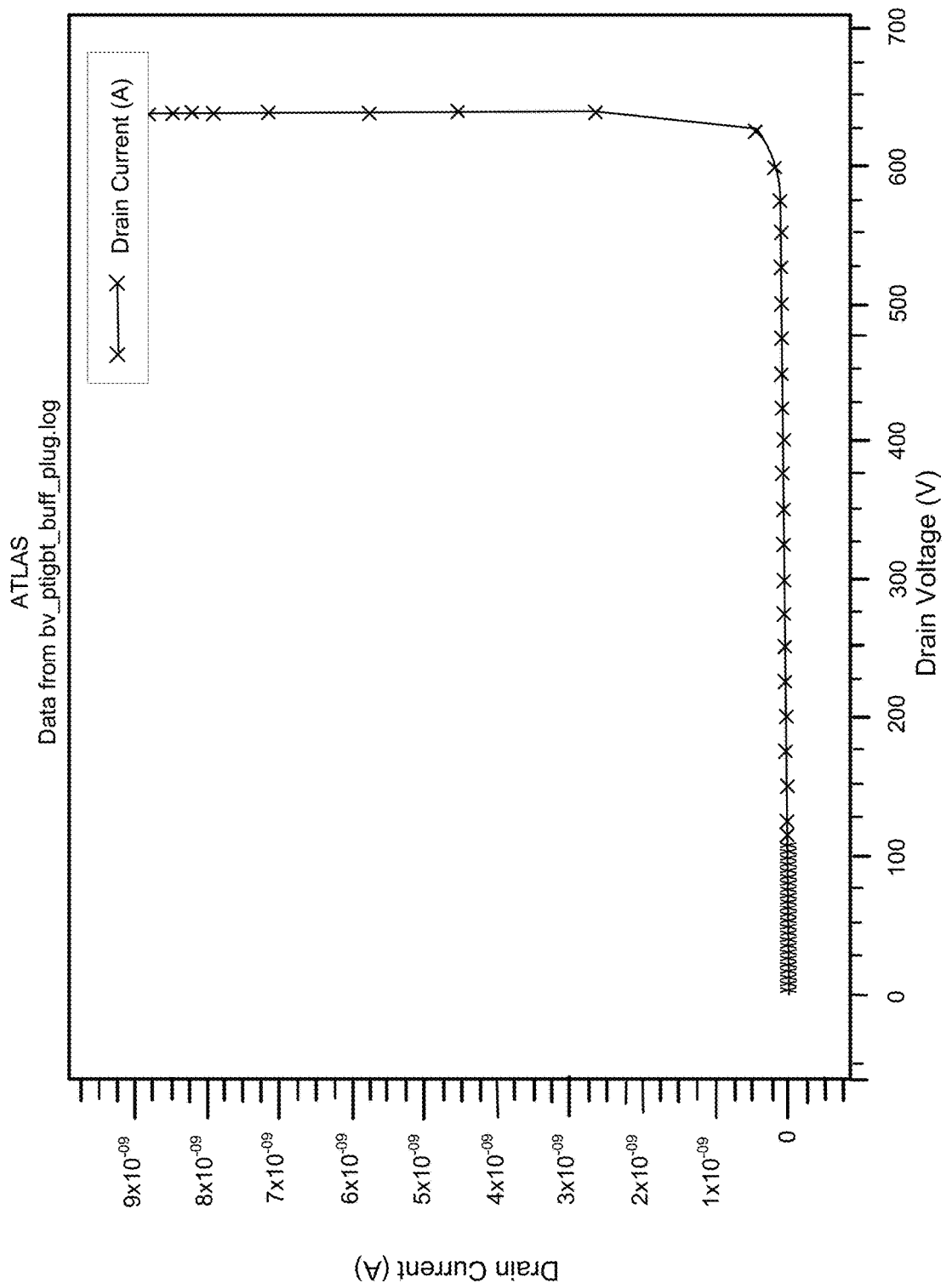
FIG. 18 is an output graph of simulated drain current of the device 1600 of FIG. 16
Figure 19:
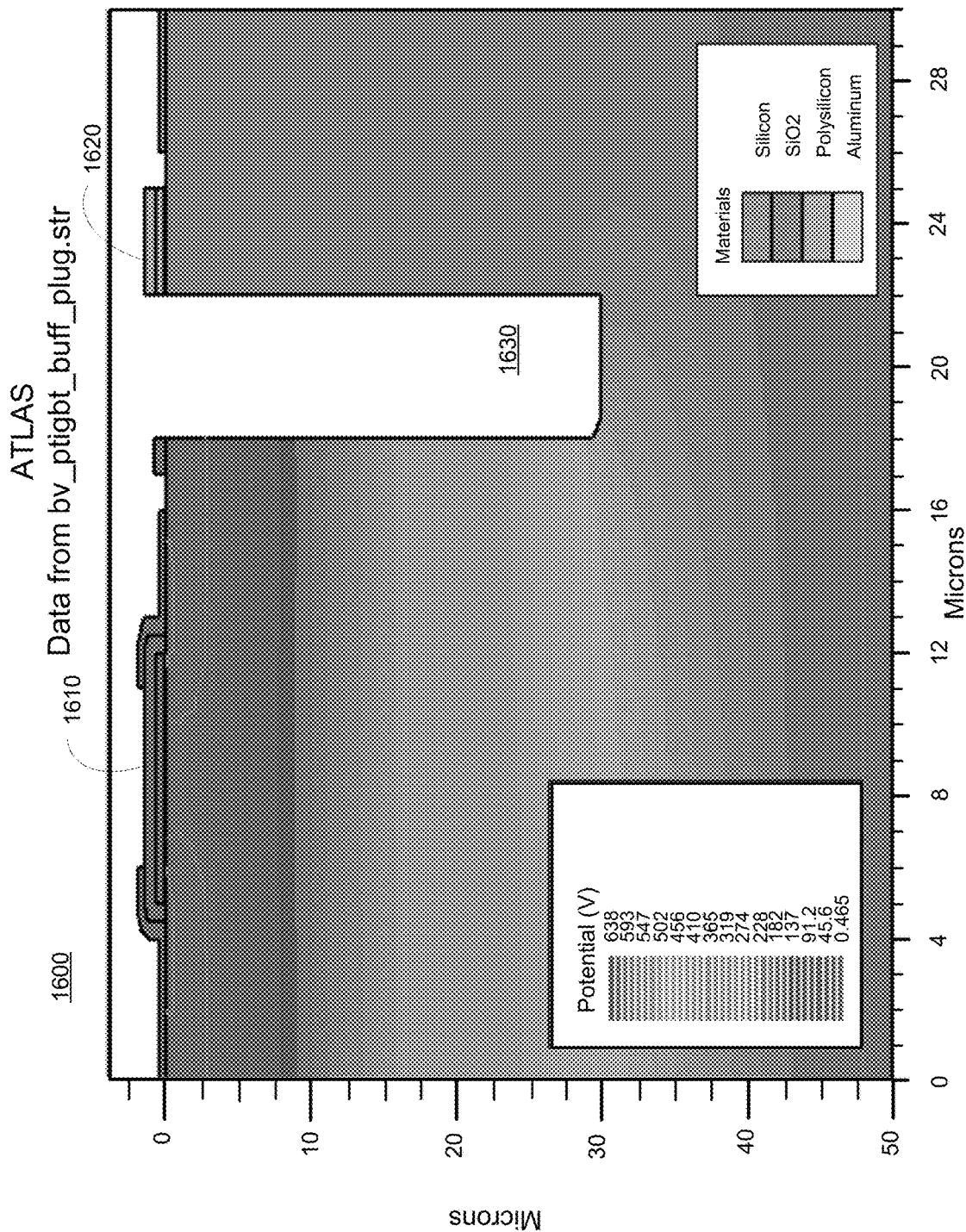
FIG. 19 is a cross-sectional view of a simulation of blocking voltage of the device of FIG. 16.

FIG. 18 is an output graph of drain current, simulated from TCAD, of the device 1600 of FIG. 16. This simulation shows that the device 1600 has a blocking voltage of over 600 volts before breakdown occurs. Thus, including the deep trench 1630 and Extraction Plug 1620 does not reduce the blocking voltage and does not negatively affect the operation of the device 1600. FIG. 19 is a TCAD simulation of the device 1600 during the blocking voltage simulation described in FIG. 18. In FIG. 19 the voltage potential lines for the device 1600 are shown. There are differences between the IGBT side of the deep trench 1630 and the opposite side of the deep trench. These differences illustrate that the electric potential (i.e., voltage) of the device 1600 is mostly blocked by presence of the deep trench 1630, and that the Extraction Plug 1620 is not exposed to the presence of voltage across the device.

Figure 20:
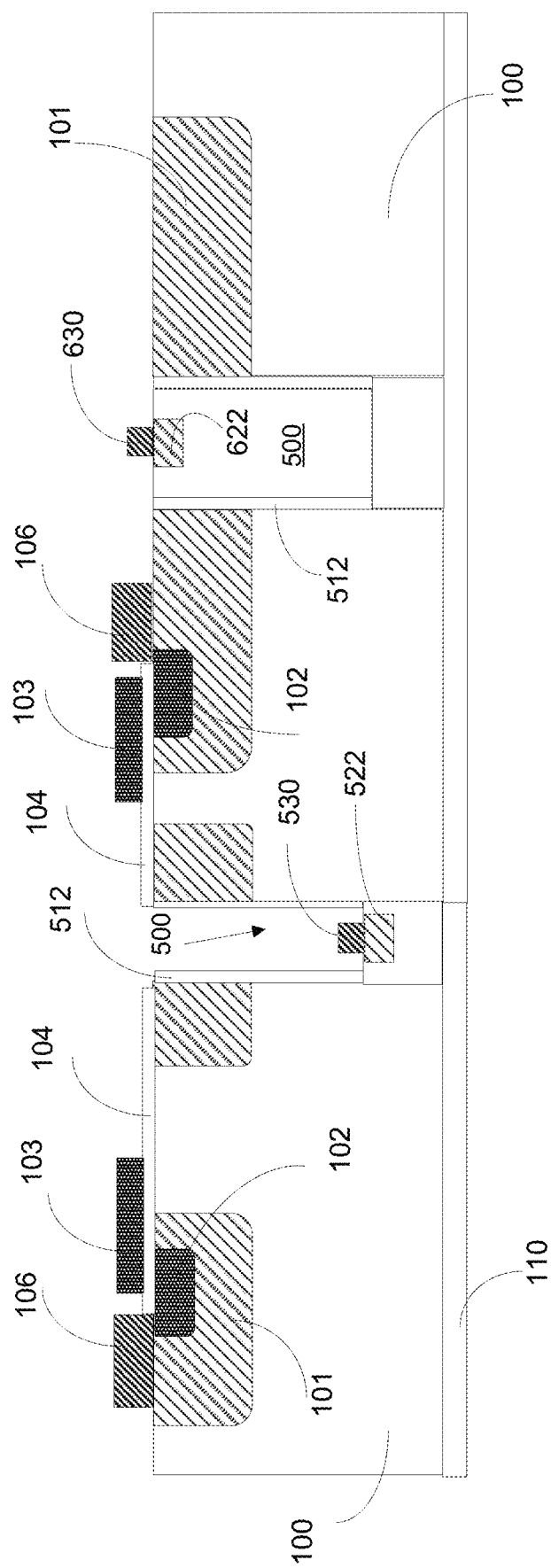
FIG. 20 is a cross-sectional view of a generic main switch, including an Extraction Plug located within an active area of a semiconductor device, according to embodiments of the invention.
Figure 21:
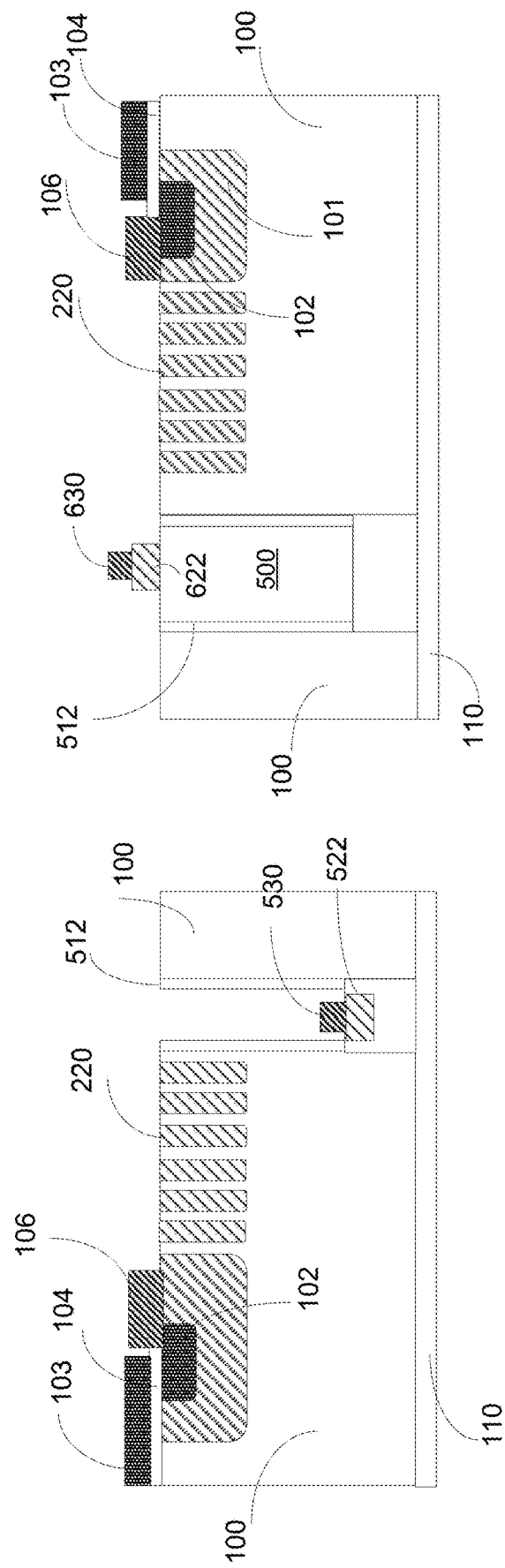
FIG. 21 is a cross-sectional view of a generic main switch, including an Extraction Plug located outside of a high voltage termination, according to embodiments of the invention.

FIG. 20 is a cross-sectional view of a generic main switch, such as an IGBT, with forced Extraction Plugs of both types, i.e., an Extraction Plug 530 that is located within a deep trench 500 and an Extraction Plug 630 that is located at the surface level of the semiconductor. FIG. 21 shows these same structures, except FIG. 20 includes the Extraction Plugs 102 within the active area of the semiconductor device, and the Extraction Plugs 102 of FIG. 21 are formed outside of a high voltage termination area. The active area of a semiconductor is the area where charge flows through or across doped silicon areas and in which the components are caused to function. The high voltage area of a semiconductor is an area that has components specifically formed within the area to withstand high voltage. These embodiments of FIGS. 20 and 21 illustrate that the invention is not limited to the IGBT devices illustrated above in FIGS. 5 and 6, but rather is applicable to a wide variety of semiconductor devices. In FIGS. 20 and 21, the backside 110 is of P-type, on top of which is an epitaxial layer 100 of N-type doping, in which a P-type 101 is formed through implant and diffusion. An N++ region 102 is formed inside of the P-well 101. To block voltage, a floating ring high voltage termination 220 is depicted in the cross section in FIG. 21, but any other type of high voltage termination can be used.

Figure 22:
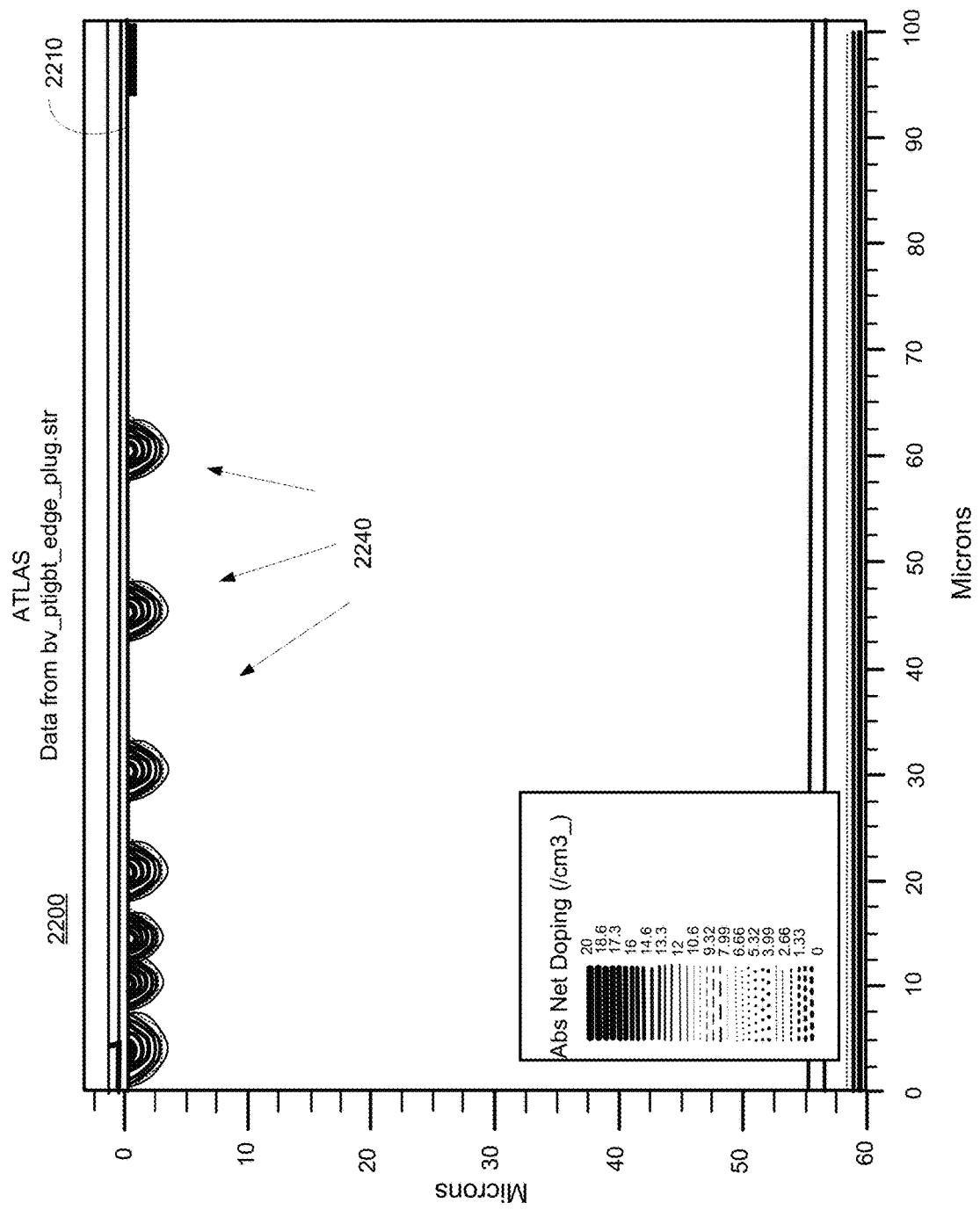
FIG. 22 is a TCAD simulation of an IGBT structure having an Extraction Plug outside of the high voltage termination, according to embodiments of the invention.
Figure 23:
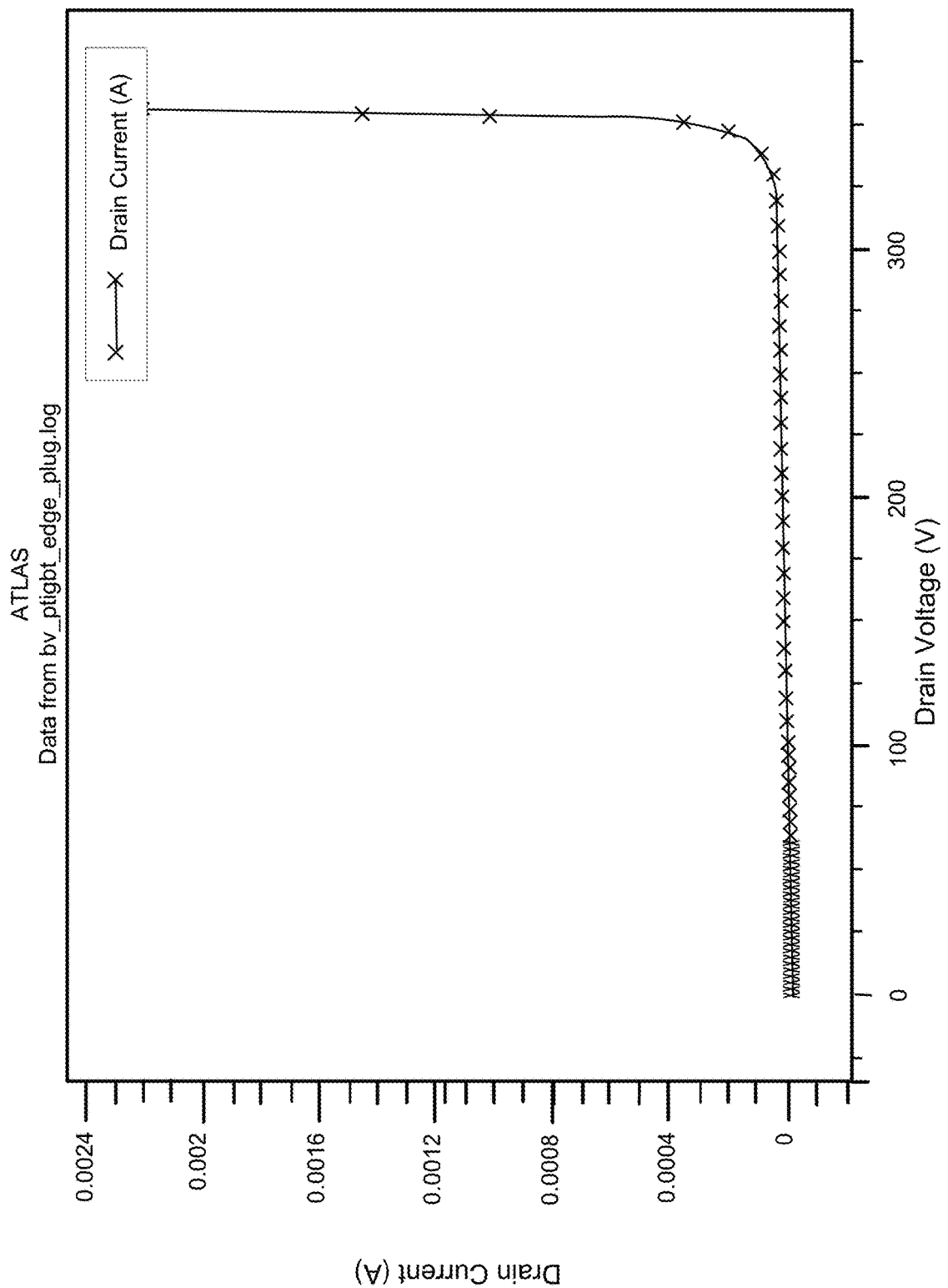
FIG. 23 is a simulated graph of current vs. voltage of the device of FIG. 22 showing a breakdown voltage, according to embodiments.
Figure 24:
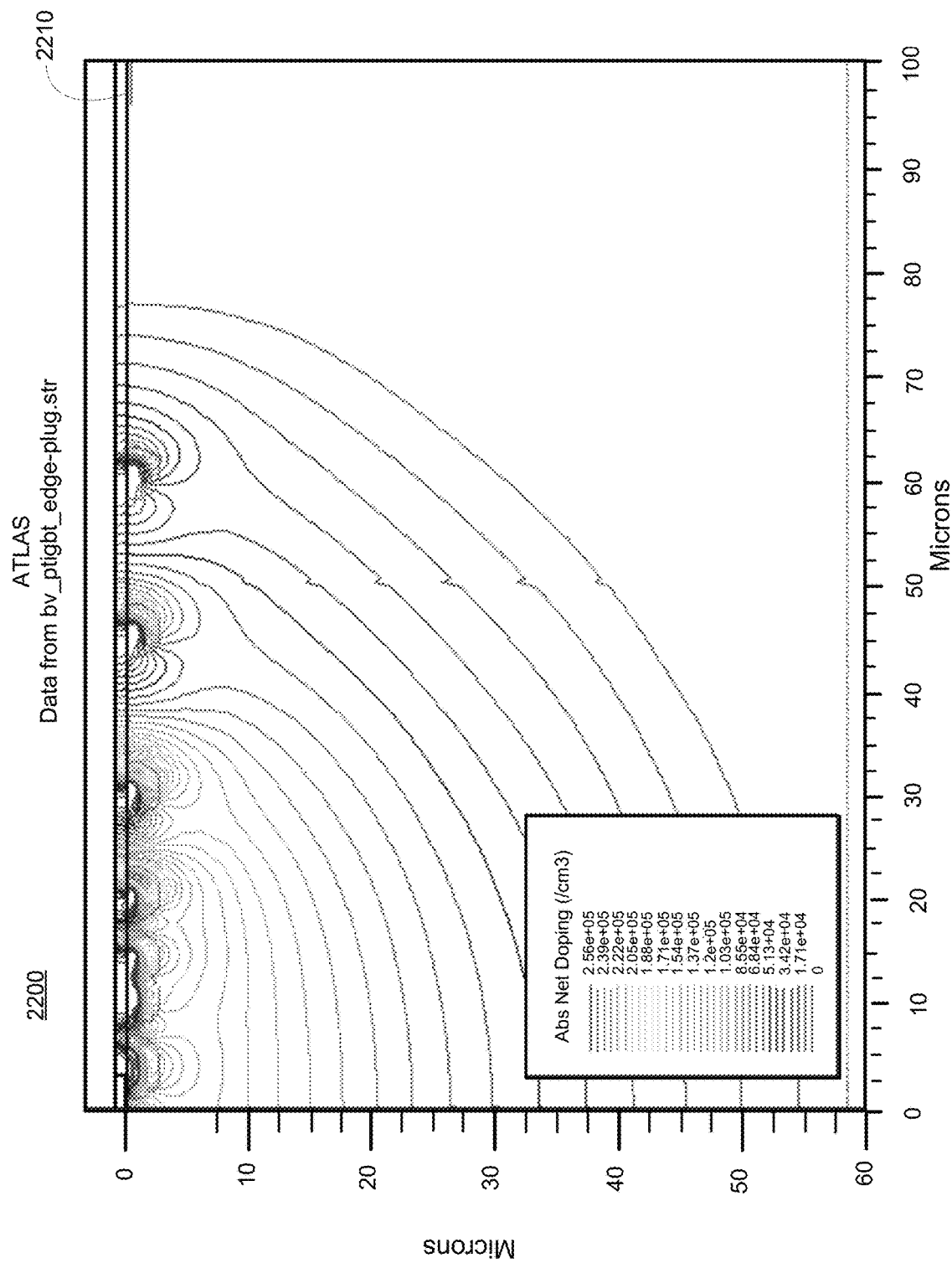
FIG. 24 is a simulated graph of electric field lines and potential lines for the device of FIG. 22, according to embodiments.

FIG. 22 illustrates a TCAD simulation of an IGBT structure 2200 having an Extraction Plug outside 2210 of a high voltage termination structure 2240. The Extraction Plug 2210 is located in the upper right corner. The high voltage termination structure 2240 is formed with successive P-type rings, which are standard in the industry. As mentioned above, although P-type ring based high voltage termination 2240 is used in the device 2200, embodiments of the invention are not limited to any particular type of high voltage termination. In FIG. 22, the placement of the Extraction Plug 2210 is spaced far enough from the high voltage termination that the potential lines do not reach the Extraction Plug. FIG. 23 graphically illustrates the breakdown voltage of an IGBT having high voltage field rings and an Extraction Plug formed outside of the high voltage termination, such as the device 2200. FIG. 23 illustrates that the device 2200 is capable of blocking over 300 volts. It should be noted that the device 2200 for this simulation is not an optimized device, but instead the simulation shows the functionality of the inventive concepts. FIG. 24 illustrates TCAD simulated electric field lines and potential lines for the device 2200. The Extraction Plug 2210 is located at the far right in the simulation illustrated in FIG. 24, and is not affected by the electric field of the device 2200.

Figure 25:
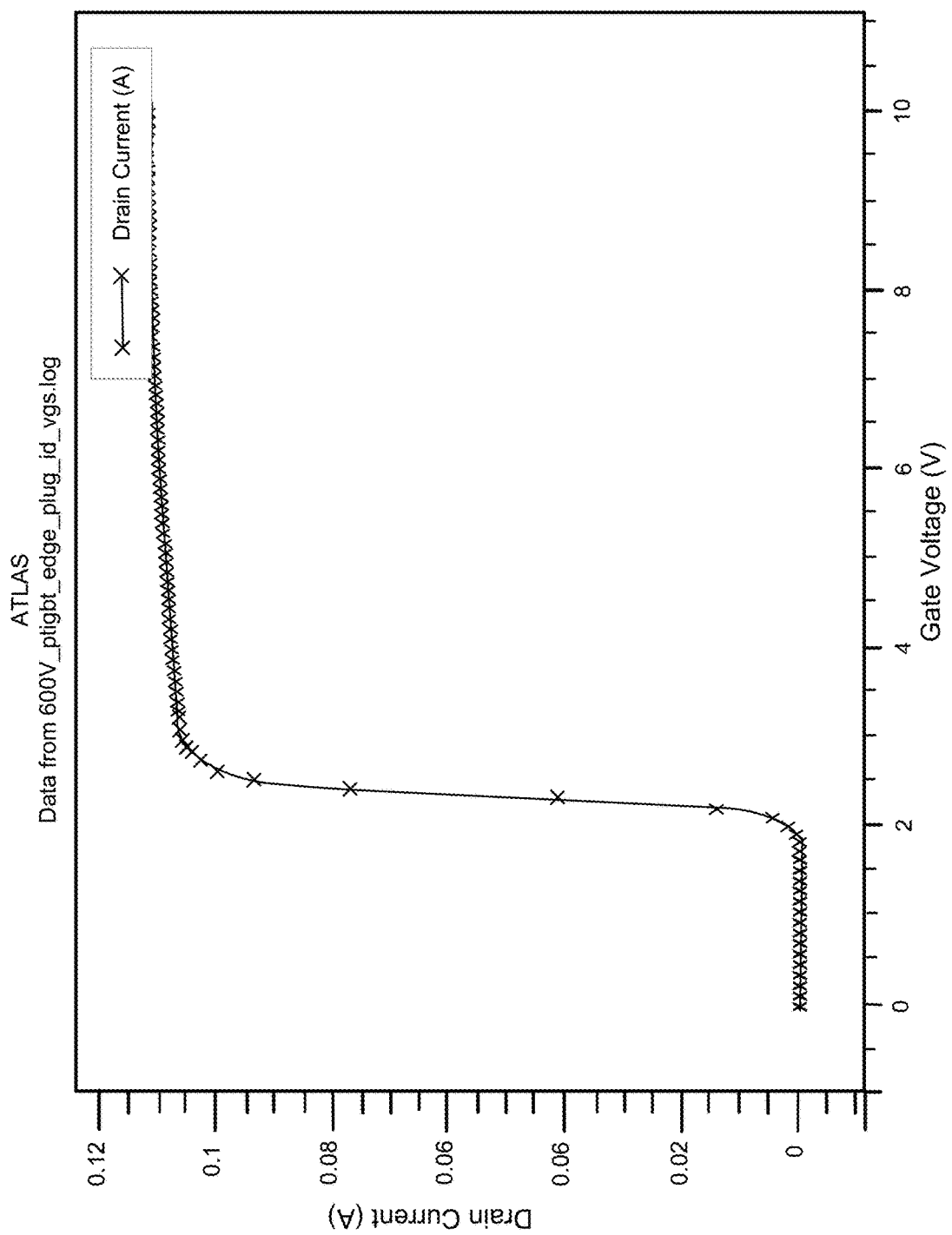
FIG. 25 is a simulated graph of current vs. voltage of the device of FIG. 22 showing a turn-on voltage, according to embodiments.

FIG. 25 shows the drain current for the simulated device 2200 over various gate voltages. This graph illustrates that the threshold gate voltage for the IGBT is just over 2 volts, which is approximately the same as IGBTs that are formed without Extraction Plugs. Again, this graph of FIG. 25 is more evidence that the operating parameters of main switches including embodiments of the invention operate in most respects very similarly to those without, with the exception that those switches made that incorporate embodiments of the invention have much faster turn-off speeds.

Figure 26:
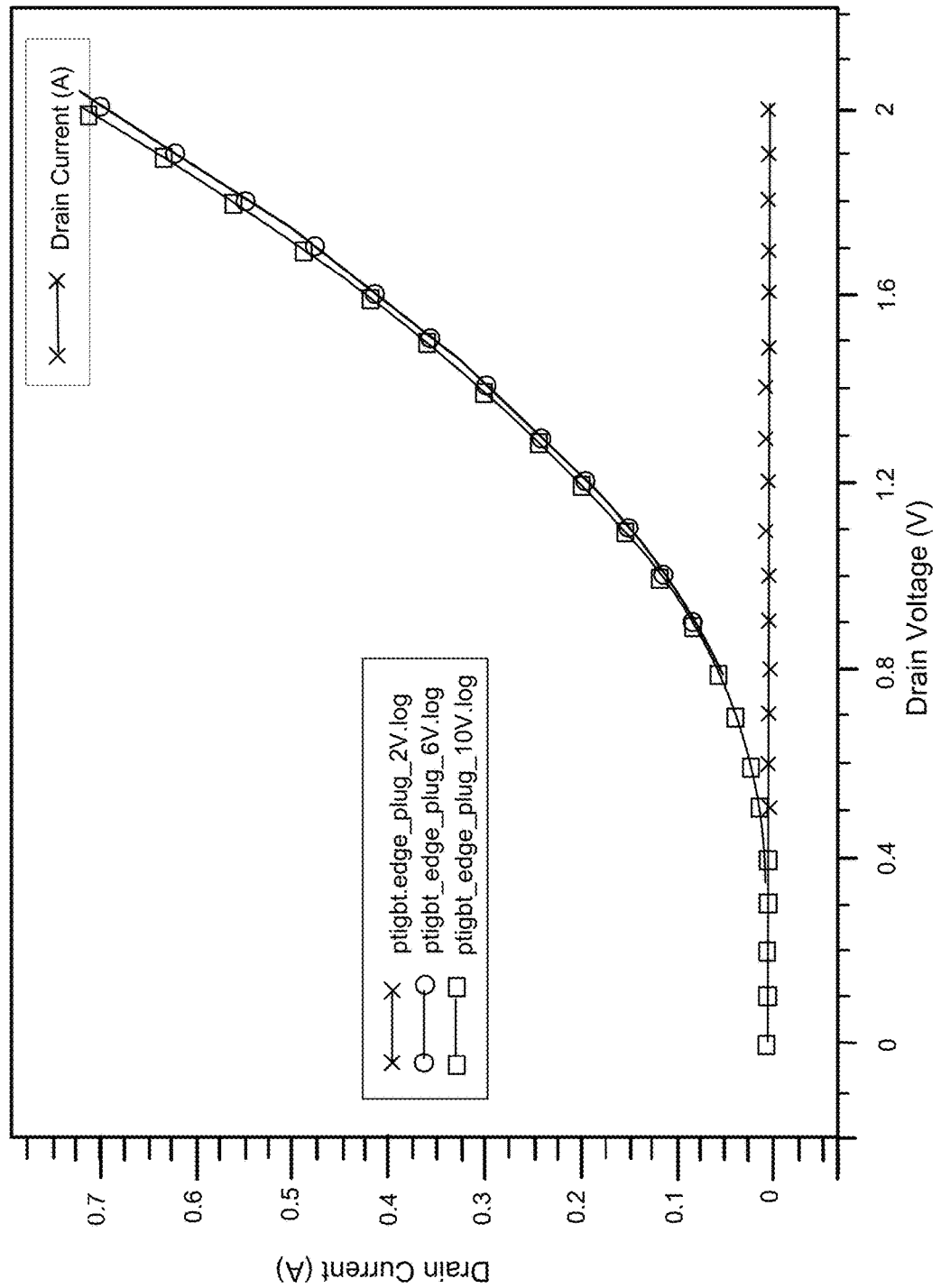
FIG. 26 is a simulated graph of current vs. voltage showing turn-on characteristics of the device of FIG. 22, according to embodiments.

FIG. 26 is a simulated output drain current vs drain voltage graph illustrating turn-on characteristics of the IGBT within the device 2200. These turn-on characteristics of the IGBT in the device 2200 are also the output characteristics of the entire device 2200. The difference traces illustrated in FIG. 26 show the simulation being run at different gate-source voltages. The nearly horizontal trace occurs when the gate-source voltage is below the turn-on threshold voltage of the device, therefore the drain current is flat. The other two traces, at 6 volts and 10 volts of gate-source voltage, illustrate that the drain current is increasing, as would be expected in this type of device. This graph of FIG. 26 illustrates that the turn-on characteristics of the IGBT in the device 2200 are not modified from standard IGBTs.

Figure 27:
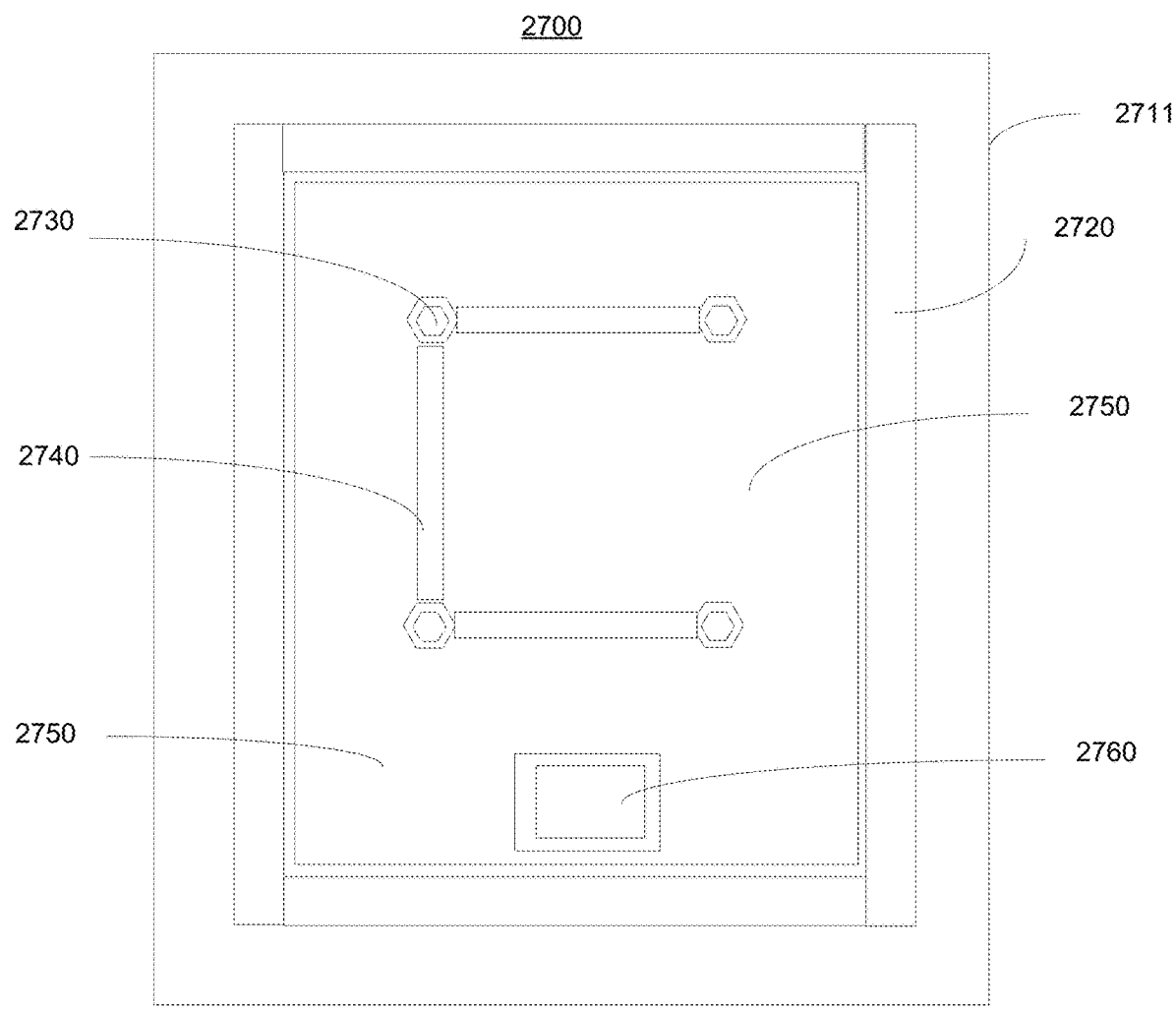
FIG. 27 is a top plan view of a semiconductor device having Extraction Plugs formed inside an active area, according to embodiments.
Figure 28:
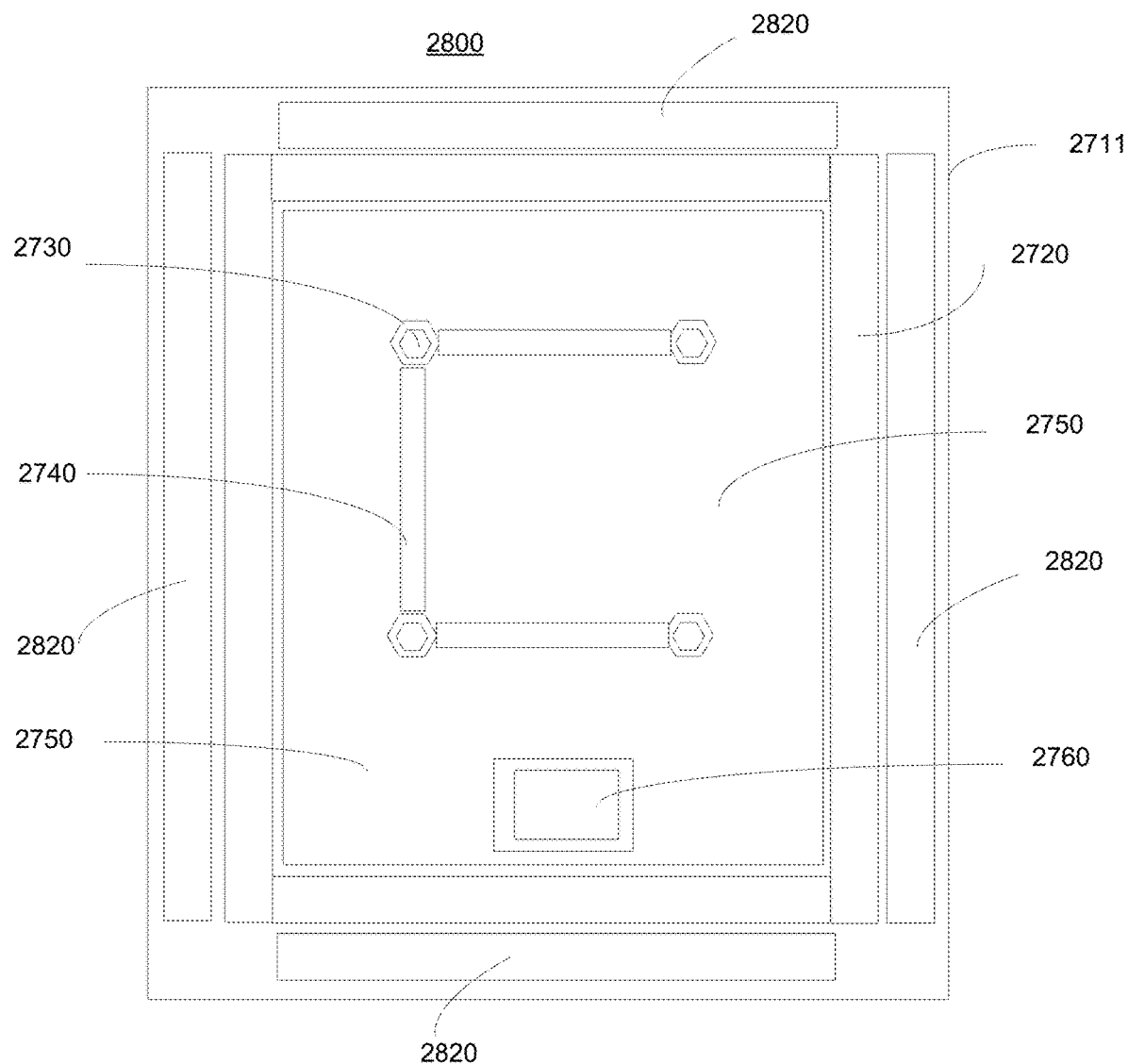
FIG. 28 is a top plan view of a semiconductor device Extraction Plugs formed inside an active area and an extraction device formed outside the active area, according to embodiments.
Figure 29:
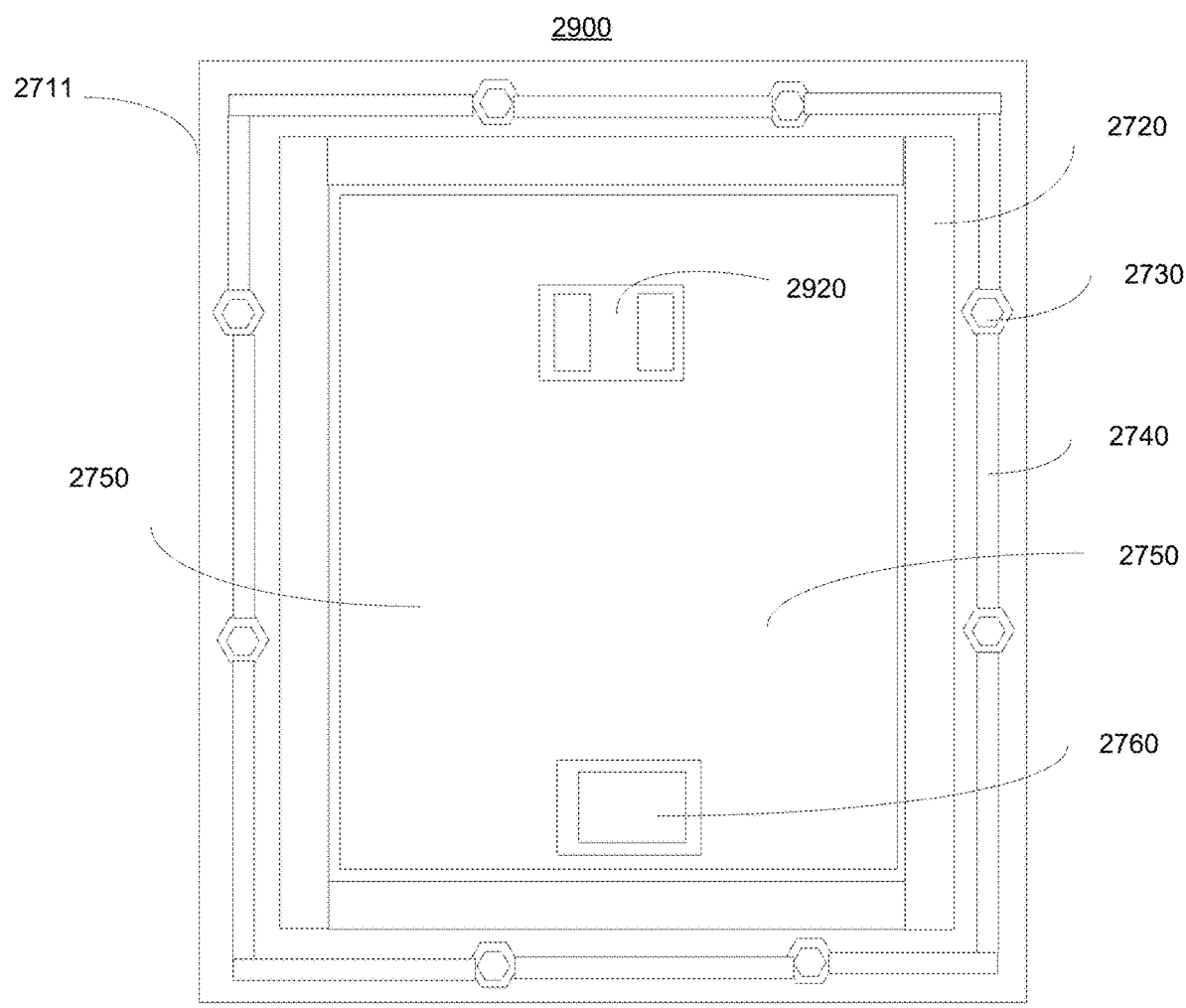
FIG. 29 is a top plan view of another semiconductor device having Extraction Plugs formed outside a high voltage active area and an extraction device formed in the active area, according to embodiments.

FIGS. 27-29 are top plan views of a portion of a semiconductor device having Extraction Plugs 2730 formed in various locations of the device, according to embodiments. In some embodiments the semiconductor device may include a main switch, such as an IGBT as described above. In some of the illustrations in FIGS. 27-29, the semiconductor device may include an extraction device, in various locations, as described in detail below with reference to specific figures. The Extraction Plugs 2730 may be examples of the Extraction Plugs 530 or 630 described above with reference to FIGS. 5 and 6. The number and placement of the Extraction Plugs 2730 according to embodiments may be varied depending on implementation specifics. The physical size of the Extraction Plugs 2730 can be the same or different from one another, even in the same device. Further, it is not unusual to have one of the Extraction Plugs 2730 made with a larger size for wire bonding purposes. As described in detail above, the Extraction Plugs 2730 can include an N++ contact area to contract the drift region of the semiconductor device. Further, the Extraction Plugs 2730 may be separated from the main switch by a trench, high voltage termination, or other voltage blocking device between the Extraction Plugs and the main device. The Extraction Plugs themselves may be formed at the bottom of the trench as illustrated, for example with reference to FIG. 5, or at the top of the trench as illustrated, for example, with reference to FIG. 6. Further, the trench may itself be placed around a column of semiconductor 100 as illustrated in FIG. 6.

With regard to specific embodiments, in FIG. 27, the Extraction Plugs 2730 are placed inside an active area 2750 of a device 2700. As described above, the active area 2750 of the device is the area within which the main electrical function of the power semiconductor device is performed. Outside the active area 2750 the device may include electrical connections or terminations that are separate from and distinct from the active components of the semiconductor. Metallizations 2740 connect the Extraction Plugs 2730 to each other, and, although not illustrated in FIG. 27, these metallizations 2740 couple the Extraction Plugs 2730 to the extraction device as well. FIG. 27 further illustrates in the active area 2750 a gate terminal 2760, which may be tied to the main switch, and, in embodiments where the extraction device is a PMOS Mosfet, the gate terminal 2760 may also be tied to such PMOS Mosfet.

FIG. 28 is a top plan view of a portion of a semiconductor device that illustrates positioning of an extraction device in relation to the other components of the device. FIG. 28 is similar in many ways to FIG. 27, and, where the functions and structures are the same, descriptions will not be repeated with reference to FIG. 28. In FIG. 28, an extraction device 2820 of device 2800 is located outside a high voltage termination 2720 of the device. Embodiments of the invention operate in an overall similar manner no matter if the extraction device 2820 is located outside the high voltage termination 2720 or if the extraction device were to be located within the active area 2750. A designer implementing embodiments of the invention may choose to place the extraction 2820 device either inside the high voltage termination 2720 or outside the high voltage termination 2720 depending on the implemented design. In the specific case where the extraction device is a PMOS extraction device, such a PMOS extraction device would typically include a relatively thick oxide layer, as described above, to protect it from high voltages, even though it is placed outside the high voltage termination 2720.

FIG. 29 is yet another top plan view of a portion of a semiconductor device 2900 having Extraction Plugs 2730. Again, the components illustrated in FIG. 29 is similar in many ways to those described with reference to FIGS. 27 and 28, and, where the functions and structures are the same, will not be repeated. In FIG. 29, the Extraction Plugs 2730 themselves and their electrical connectors 2740 are located outside the high voltage termination 2720. When the Extraction Plugs 2730 are made outside the high voltage termination 2720, it is not necessary to include trench structures to separate the Extraction Plugs 2730 from the main switch, because the high voltage termination 2720 itself provides electrical separation from the main switch. Instead, the Extraction Plugs 2730, when formed outside of the high voltage termination 2720, may be made directly in the semiconductor, with no trenches necessary. In FIG. 29, an extraction device 2920 is formed within the active area 2750 of the device 2900. In FIG. 29, a controlling terminal (not separately illustrated) of the extraction device 2920 would be electrically coupled to the gate 2760 of the main switch. Further an input pad (one of the two pads illustrated in the extraction device 2920) is electrically coupled to one or more of the Extraction Plugs 2730. Finally, an output pad (the other of the two pads illustrated in the extraction device 2920) is electrically coupled to an output of the main switch. In the case where the main switch is an IGBT, the output of the extraction device 2920 is coupled to the collector of such an IGBT.

Embodiments of the invention may be developed as a hybrid of all of the devices described with reference to FIGS. 27-29, with some Extraction Plugs 2730 located inside the high voltage termination area 2720 and some Extraction Plugs 2730 located outside the high voltage termination area within the same device itself. Similarly, the extraction device may be located inside the active area, such as in FIG. 29, or outside of the high voltage termination, such as illustrated in FIG. 28.

Figure 30:
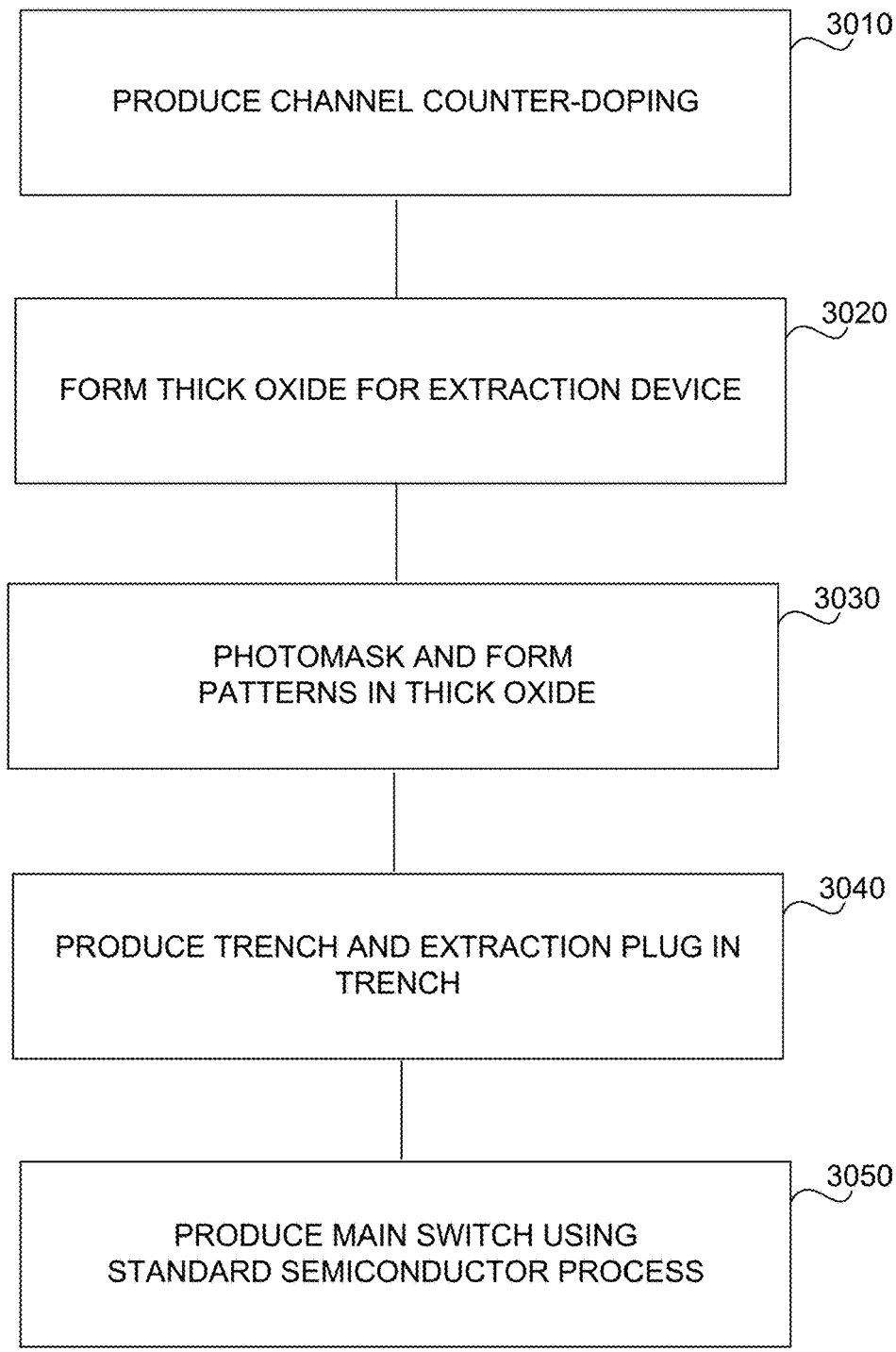
FIG. 30 is a flowchart illustrating example operations for producing a power semiconductor device with forced extraction according to embodiments of the invention.

FIG. 30 is a flowchart illustrating example operations for producing a power semiconductor device with forced extraction according to embodiments of the invention. An example flow 3000 begins at an operation 3010 to counter-dope particular channel areas. For this operation 3010, first a photomask is created to define the channel areas where a counter doping implant will be performed for the PMOS extraction device. Then the channel is counter doped with an implant tailored to achieve the desired turn on threshold voltage of the PMOS extraction device.

Next, in an operation 3020, a thick oxide layer is formed. The thick oxide layer may be thermally grown using known methods, but the process is time-consuming and may also alter the vertical doping profile of the starting semiconductor material. It may be preferable, therefore, to first deposit the thick oxide layer and then densify the deposited oxide layer. This latter process has the advantage of not altering the doping profile of the starting material. Then, in an operation 3030, the thick oxide layer, no matter how it was created, is patterned to form the thick oxide layer that will be under the gate of the PMOS extraction device. Obviously, the number, position, and relative size of these thick gate oxide layers is depending on where and how many PMOS extraction devices are present in the final device.

Following operation 3030, a trench in the semiconductor is made using standard techniques. Then, an Extraction Plug is formed in the trench. As described above, the Extraction Plug may be formed at the base of the trench, or near the surface of the silicon. In either case, the Extraction Plug is in electrical contact with the drift region of the semiconductor to remove carriers when the main switch turns off. The Extraction Plug is also electrically coupled, through metal traces or in other ways, to the PMOS extraction device, so that carriers can be removed from the drift region through the metal traces and through the extraction device when the main switch turns off.

After the operations 3010, 3020, 3030, and 3040, then the 'standard' process flow of creating a main switch, IGBT, or other type of voltage controlled power semiconductor may be performed in one or more operations 3040. In some embodiments it may be preferable that the same polysilicon process be used for the gate of the IGBT and the gate of the PMOS extraction device, in the case when the Extraction Device is a PMOS.

Although the operations described with reference to FIG. 30 are listed in numerical order, for convenience of description, in practice they may be made in any order.

Although the above description has been made with reference to an N-channel IGBT and a P-Channel extraction device, embodiments of the invention also work with oppositely made devices. Meaning, the IGBT may be a P-Channel device while the extraction device is an N-channel MOS device that operates as an extraction device.

EXAMPLE EMBODIMENTS

In accordance to the present disclosure, an IGBT or other semiconductor device may take the following forms, along with their equivalents.

Example 1 includes an integrated IGBT or a Main Switch, with forced Extraction Plugs and a forced extraction PMOS or a forced extraction device. The forced extraction PMOS or forced extraction device may be placed on the same chip. The gate of the forced extraction PMOS or the gate of the said forced extraction device is tied to the gate of the IGBT or to the gate of the Main Switch. The source of the forced extraction PMOS or of the said forced extraction device is connected to the said Extraction Plugs of the IGBT or to the said Extraction Plugs of the main switch, and has its drain connected to the backside of the IGBT die.

Example 2 includes an IGBT or a main switch of any type that has Extraction Plugs placed either in the active area of the IGBT or of the main switch, or outside of the termination. The Extraction Plugs are placed in the region of the device where the carrier recombination process takes place and have the role to provide a removal path for the carriers, and in this way speeds up the switching speed of the IGBT or of the main switch.

Example 3 includes a forced extraction device, like a forced extraction PMOS transistor with a gate oxide able to withstand the rated voltage of the IGBT or of the main switch, or any type of three terminal device that is OFF during the On Phase of the IGBT or of the Main Switch, and is ON only during the turn off of the IGBT or of the Main Switch. The blocking voltage between selected terminals of the forced extraction device are the same or higher than the blocking voltage of the IGBT or of the Main Switch. See, for example, Table 2, where the BVdss of the PMOS is 'low'.

Example 4 includes a forced extraction IGBT or forced extraction switch, that has extraction pads connected together with a forced extraction device, or a forced extraction PMOS. In this example, the gates of the IGBT or forced extraction switch are tied together with the gates of the force extraction device, or forced extraction PMOS. The source of the forced extraction PMOS is connected to the Extraction Plugs of the IGBT or to the extraction pads of the main switch, and the drains of the forced extraction PMOS or Electrode 2 of the forced extraction device are connected to the backside of the forced extraction IGBT or forced extraction Main Switch.

Example 5 includes an IGBT or a Main Switch provided with Extraction Plugs that are accessing the region of the device where the carriers cannot be removed other than by recombination. The said Extraction Plugs are formed such that their presence does not negatively affect the electrical parameters of such main switch.

Example 6 includes a forced extraction device that it OFF when the Main Switch is ON and is ON during the turn-off phase of the switching process of the Main Switch. Further, the sustaining voltage between selected terminals of the forced extraction device is the same or higher than the highest blocking voltage of the Main Switch.

Example 7 includes an IGBT or a Main Switch in a discrete or integrated combination with a forced extraction device that meets the requirements of Example 6.

Example 8 includes an IGBT or a main switch of any type, that has Extraction Plugs placed either in the active area of the IGBT or of the main switch, or outside of the termination. The Extraction Plugs of this example are placed in the region of the device where the carrier recombination process takes place and have the role to provide a removal path for the carriers. In this way the device according to this example speeds up the switching speed of the IGBT or of the main switch.

Example 9 includes an IGBT or a Main Switch for which the forced Extraction Plugs are made using deep trenches and have contact regions at the bottom of the trenches. The contact regions are accessible by connecting metal plugs made of refractory metals.

Example 10 includes an IGBT or a Main Switch for which the forced Extraction Plugs are made using deep trenches surrounding columns of the starting semiconductor (Silicon or SiC) and have the contact N++ regions at the top of the columns.

Example 11 includes an IGBT or a Main Switch for which the forced Extraction Plugs are made by filling the trenches with heavily doped Polysilicon.

Example 12 includes a forced extraction enhancement mode PMOS transistor that has a dielectric strength of the gate oxide such that its BVgss is higher than 600V made on any type of semiconductor (Silicon or SiC). Specifically the BVgss may be on the order of 1000V. Further, the BVgss may be on the order of 10,000V.

Example 13 includes a lateral forced extraction PMOS transistor with BVgss higher than 600V with multiple layers of dielectric underneath the gate. Specifically the BVgss may be on the order of 1000V. Further, the BVgss may be on the order of 10,000V.

Example 14 includes a lateral forced extraction PMOS transistor with BVgss higher than 600V that is built on an insulator substrate. Specifically the BVgss may be on the order of 1000V. Further, the BVgss may be on the order of 10,000V.

Example 15 includes a vertical forced extraction PMOS transistor with BVgss higher than 600V. Specifically the BVgss may be on the order of 1000V. Further, the BVgss may be on the order of 10,000V.

Example 16 includes a forced extraction PMOS with a thick gate oxide and the doping of the substrate, initial or counter-doped in the range of 1E13-1E14 atoms/cm3.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A semiconductor device formed on a semiconductor substrate, comprising:
    a power semiconductor switch structured to employ conductivity modulation using charge carriers in a drift region when the power semiconductor device is turned on, the power semiconductor switch having a gate terminal, an emitter terminal, and a collector terminal:
    a metal Extraction Plug in electrical contact with the drift region of the power semiconductor switch, through a low resistance contact region formed in the drift region of the power semiconductor; and
    an extraction device electrically coupled to the Extraction Plug through a metal connection, the extraction device additionally coupled to the gate terminal and the collector terminal of the power semiconductor switch, the extraction device in an off state when the power semiconductor device is turned on, and the extraction device structured to turn on to remove charge carriers from the drift region through the Extraction Plug to the collector terminal when the power semiconductor switch is turned off.

2. The semiconductor device according to claim 1, in which the Extraction Plug is formed in a trench that isolates the Extraction Plug from the power semiconductor switch.

3. The semiconductor device according to claim 2, in which the Extraction Plug is formed adjacent a bottom surface of the trench.

4. The semiconductor device according to claim 2, in which the Extraction Plug is formed adjacent a top surface of the semiconductor substrate.

5. The semiconductor device according to claim 1, in which the Extraction Plug is isolated from the power semiconductor switch by a high voltage termination.

6. The semiconductor device according to claim 1, in which the extraction device has an operating voltage at least as high as an operating voltage of the power semiconductor switch.

7. The semiconductor device according to claim 1, in which the power semiconductor switch comprises an Insulated Gate Bipolar Transistor comprising an n-channel Metal-Oxide-Semiconductor Field Effect Transistor (MOSFET), and in which the extraction device is a p-channel MOSFET having a gate oxide that can withstand the rated voltage of the IGBT.

8. The semiconductor device according to claim 1, in which the extraction device is formed on a semiconductor substrate that is separate from the semiconductor substrate on which the power semiconductor switch is formed.

9. A semiconductor device employing conductivity modulation and being voltage controlled, formed on a semiconductor substrate, the semiconductor device comprising:

a power semiconductor switch having a drift region in the semiconductor substrate, a gate for controlling operation of the power semiconductor switch, and a collector terminal;

a metal Extraction Plug in electrical contact with the drift region of the power semiconductor switch, the Extraction Plug separated from the power semiconductor switch by a voltage blocking device; and an extraction device having a control gate electrically coupled to the gate of the power semiconductor switch, and structured to be controlled by a same control signal that controls operation of the power semiconductor switch, the extraction device further electrically coupled to the Extraction Plug through a conductive trace and structured to turn on to remove charge carriers from the drift region to the collector terminal through the Extraction Plug when the power semiconductor switch is turned off.

10. The semiconductor device according to claim 9, in which the extraction device is isolated from the power semiconductor switch by a trench formed in the semiconductor substrate.

11. The semiconductor device according to claim 9, in which the extraction device is isolated from the power semiconductor switch by a high voltage termination formed in the semiconductor substrate.

12. The semiconductor device according to claim 9, in which the extraction device is OFF when the power semiconductor switch is ON, and in which the extraction device is ON when the power semiconductor switch is OFF.

13. The semiconductor device according to claim 9, in which the power semiconductor switch and the extraction device are configured as a three-terminal device in which the gate of the power semiconductor switch and the control gate of the extraction device are connected together and to an input terminal of the three-terminal device, in which an emitter of the power semiconductor switch is coupled to a ground terminal of the three-terminal device, and in which a source of the extraction device is coupled to the collector terminal of the power semiconductor switch and to an output terminal of the three-terminal device.

14. The semiconductor device according to claim 9, in which the power semiconductor switch is an Insulated Gate Bipolar Transistor.

15. A method of operating a power semiconductor switch that employs conductivity modulation, the power semiconductor switch having a control terminal and an output terminal, the method comprising:

using the control terminal to turn on the power semiconductor switch to generate electrons and holes as charge carriers in a drift region;

using the control terminal to turn off the power semiconductor switch;

at the same time the power semiconductor switch is turned off, using the control terminal to turn on a charge-carrier extraction device; and removing charge carriers from the drift region of the power semiconductor switch with the charge-carrier extraction device to the output terminal through a metal Extraction Plug formed in the drift region of the power semiconductor switch.

16. The method according to claim 15, in which removing charge carriers from the drift region comprises coupling the charge carriers to the output terminal of the power semiconductor switch through the extraction device.

17. The method according to claim 16, in which the power semiconductor switch comprises an Insulated Gate Bipolar Transistor comprising an n-channel Metal-Oxide-Semiconductor Field Effect Transistor (MOSFET), and in which the extraction device is a p-channel MOSFET.

* * * * *